(12) United States Patent
Walker

(10) Patent No.: US 11,545,281 B2
(45) Date of Patent: Jan. 3, 2023

(54) FLEXIBLE, INTERRUPTIBLE RADIAL BUS AND BUS-MOUNTED BEAD DEVICE

(71) Applicant: Myron Walker, Redmond, WA (US)

(72) Inventor: Myron Walker, Redmond, WA (US)

(73) Assignee: EMONSTER INC, Seattle, WA (US)

( * ) Notice: Subject to any disclaimer, the term of this patent is extended or adjusted under 35 U.S.C. 154(b) by 46 days.

(21) Appl. No.: 17/167,035

(22) Filed: Feb. 3, 2021

(65) Prior Publication Data

US 2021/0257783 A1 Aug. 19, 2021

Related U.S. Application Data

(63) Continuation of application No. PCT/US2019/045180, filed on Aug. 5, 2019.
(Continued)

(51) Int. Cl.
*H01R 13/648* (2006.01)
*H01B 7/04* (2006.01)
(Continued)

(52) U.S. Cl.
CPC ............ *H01B 7/04* (2013.01); *F21V 19/0025* (2013.01); *F21V 23/001* (2013.01); *H01B 7/009* (2013.01);
(Continued)

(58) Field of Classification Search
CPC ........ H01B 7/04; H01B 7/0045; H01B 7/009; H05B 45/00; H01R 13/6461; H01R 13/6587; H01R 43/02; H04L 12/40169; H01L 25/0753; H05K 1/181; H05K 1/189; F21V 19/0025; F21V 23/001; F21S 4/22; F21S 2/005; F21Y 2103/10; F21Y 2115/10
(Continued)

(56) References Cited

U.S. PATENT DOCUMENTS 5,635,911 A 6/1997 Landers et al.
6,566,610 B1 5/2003 Nguyen et al.
(Continued)

FOREIGN PATENT DOCUMENTS

EP 0447001 A2 9/1991

OTHER PUBLICATIONS

International Search Report for PCT/US19/045180 from the International Searching Authority/US, dated Oct. 21, 2019.
(Continued)

*Primary Examiner* — Khiem M Nguyen
(74) *Attorney, Agent, or Firm* — AEON Law, PLLC; Adam L. K. Philipp; David V. H. Cohen

(57) ABSTRACT

A multi-conductor bus with radially arranged conductor wires on which addressable bead devices that may incorporate light-emitting diodes (LEDs) or other surface mount devices (SMDs) can be easily mounted. The radial bus is designed to provide an improved range of flexibility and motion while allowing for easy addition of bead devices along its length that utilize self-addressing bus protocols such as cascading device protocols. The design of the flexible, interruptible radial bus facilitates the use of pass-through and interrupted paths along the bus that simplifies the installation of addressable devices along the bus such as the bus-mounted bead devices disclosed herein.

8 Claims, 41 Drawing Sheets

Related U.S. Application Data

(60) Provisional application No. 62/714,606, filed on Aug. 3, 2018.

(51) Int. Cl.
*H01L 25/075* (2006.01)
*H01B 7/00* (2006.01)
*H05K 1/18* (2006.01)
*H01R 43/02* (2006.01)
*F21V 23/00* (2015.01)
*F21V 19/00* (2006.01)
*H05B 45/00* (2022.01)
*H01R 13/6461* (2011.01)
*H01R 13/6587* (2011.01)
*H04L 12/40* (2006.01)
*F21Y 103/10* (2016.01)
*F21Y 115/10* (2016.01)
*F21S 4/22* (2016.01)
*F21S 2/00* (2016.01)

(52) U.S. Cl.
CPC ....... *H01B 7/0045* (2013.01); *H01L 25/0753* (2013.01); *H01R 13/6461* (2013.01); *H01R 13/6587* (2013.01); *H01R 43/02* (2013.01); *H04L 12/40169* (2013.01); *H05B 45/00* (2020.01); *H05K 1/181* (2013.01); *H05K 1/189* (2013.01); *F21S 2/005* (2013.01); *F21S 4/22* (2016.01); *F21Y 2103/10* (2016.08); *F21Y 2115/10* (2016.08)

(58) Field of Classification Search
USPC .............................................. 439/67.05–67.7
See application file for complete search history.

(56) References Cited

U.S. PATENT DOCUMENTS

| | | |
|---|---|---|
| 6,734,374 B2 | 5/2004 | Tang |
| 8,348,702 B2 | 1/2013 | Lin |
| 8,492,175 B1 | 7/2013 | Fanfelle |
| 2008/0137332 A1 | 6/2008 | Lo et al. |
| 2009/0163083 A1 | 6/2009 | Sawatari et al. |
| 2009/0284435 A1 | 11/2009 | Elmore |
| 2012/0326634 A1 | 12/2012 | Li |
| 2015/0102943 A1 | 4/2015 | Greet et al. |
| 2016/0066395 A1 | 3/2016 | Yao et al. |
| 2020/0043632 A1* | 2/2020 | Walker ............... H01R 13/6658 |

OTHER PUBLICATIONS

Written Opinion of the International Searching Authority for PCT/US19/45180, from the International Searching Authority/US, dated Oct. 21, 2019.

\* cited by examiner

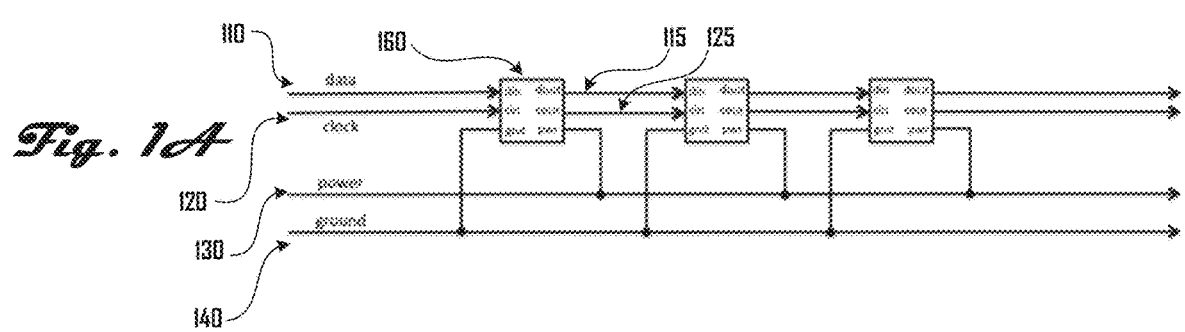
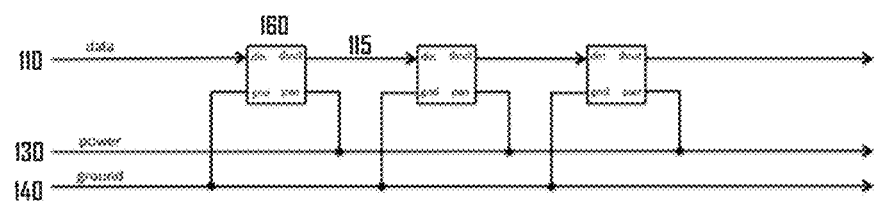
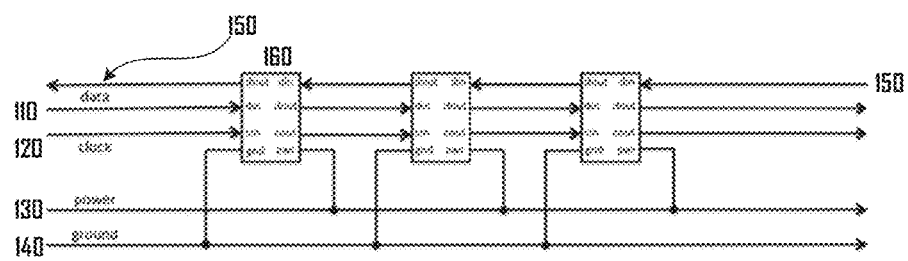
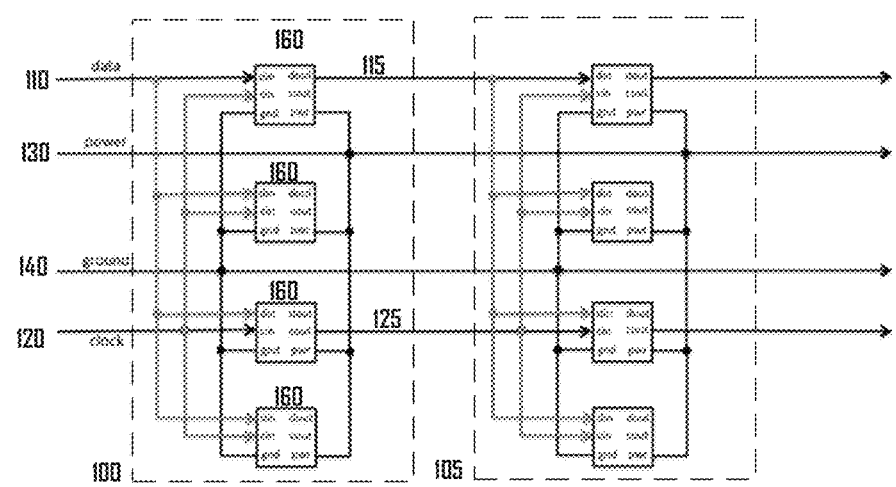

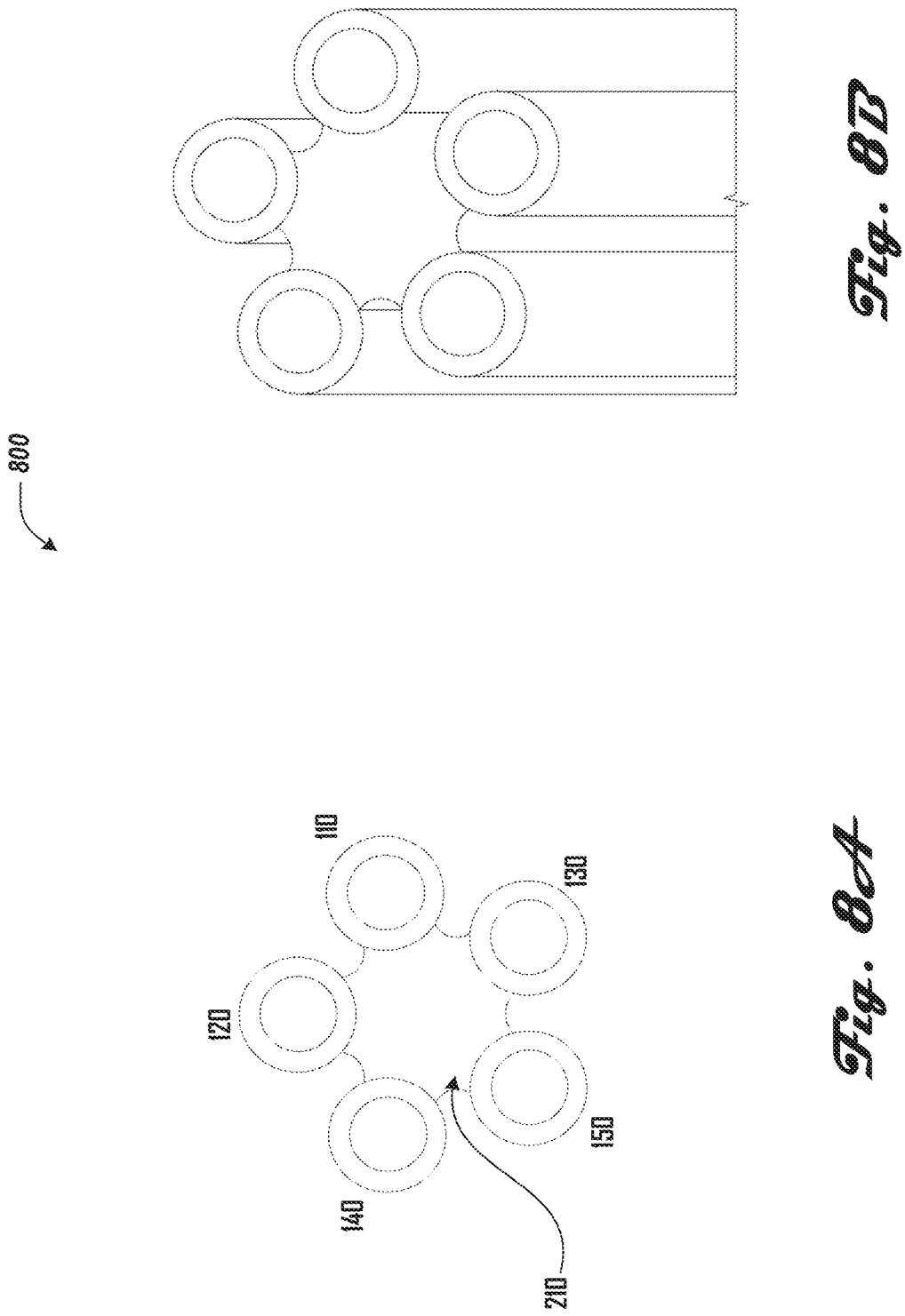

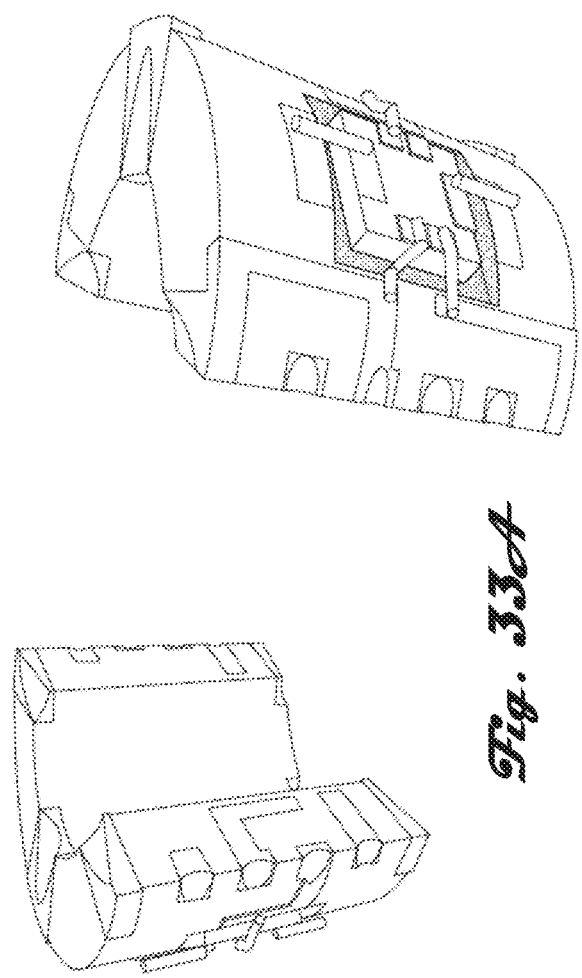
Fig. 33A
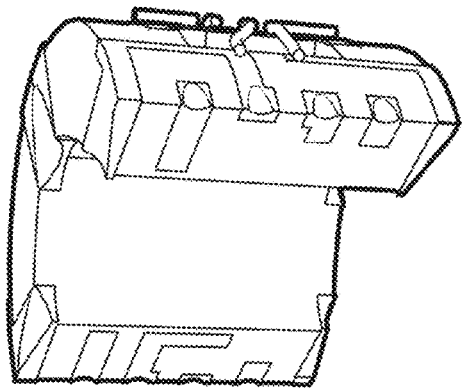
Fig. 33B
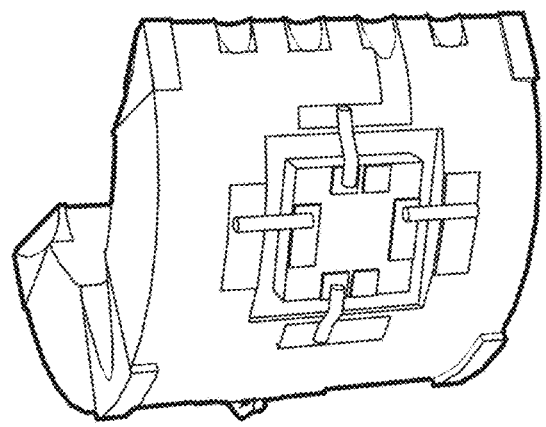

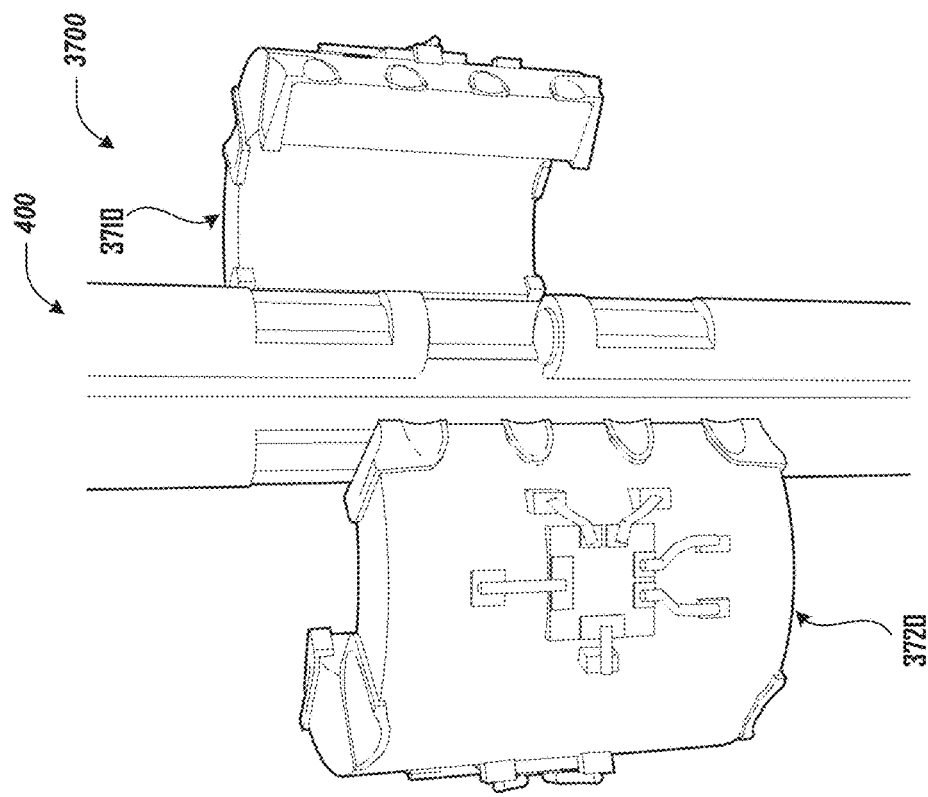
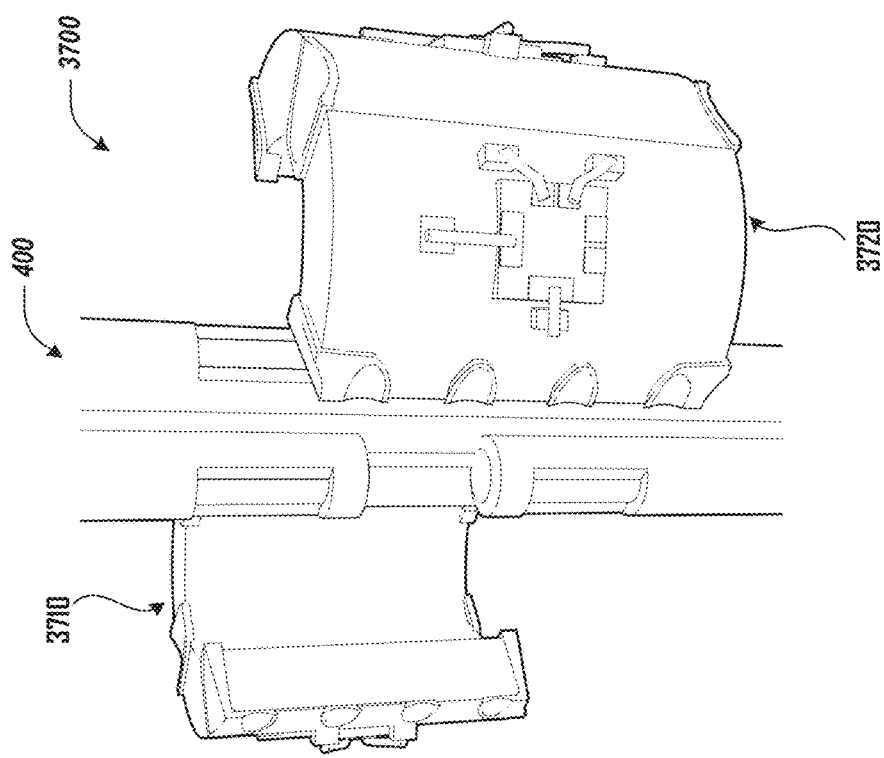
Fig. 37B
Fig. 37A

FLEXIBLE, INTERRUPTIBLE RADIAL BUS AND BUS-MOUNTED BEAD DEVICE

This application claims priority to PCT International Patent Application No. PCT/US2019/045180, filed Aug. 5, 2019, which claims the benefit of provisional U.S. Patent Application No. 62/714,606, filed Aug. 3, 2018, titled "RADIAL EXTENDED FLEXIBLE BUS AND BEAD SMD DEVICE," and naming Myron Walker as inventor. The above-cited applications are hereby incorporated by reference, in its entirety, for all purposes. The Application Data Sheet filed herewith forms a part of the present application, and all priority documents to which it refers are incorporated by reference herein in their entirety.

FIELD

This disclosure is directed to improved systems and methods of constructing a bus on which addressable bead devices are mounted.

BACKGROUND

There are three common methods for connecting devices in a device chain along a bus. Those methods are a loose or twisted wire bus with plugs along the bus, flexible printed circuit board (PCB) or flex-print buses, and flat ribbon cable.

In a loose wire bus with electrical connections or plugs attaching, e.g., light-emitting diodes (LEDs) to the bus, the wires might be twisted together around each other or wrapped in a sleeve around the outside to protect the LEDs and electrical connections, or both.

The second type is flex-print in which the LEDs are surface mounted (i.e., soldered) onto a flexible printed circuit board that has a repeating connection pattern, which creates the bus pattern to connect the devices into a device chain.

BRIEF DESCRIPTION OF THE DRAWINGS

FIGS. 1A-1D illustrate clocked cascading device chain wiring diagrams.

FIGS. 8A-8B illustrate an end view and an isometric view of a five-wire radial bus in a pentagonal arrangement in accordance with one embodiment.

FIG. 11 illustrates a perspective view of an LED bead device's inner conductive elements in accordance with one embodiment.

FIG. 12 illustrates a perspective view of cylindrical filler around the inner conductive elements of FIG. 11 in accordance with one embodiment.

FIG. 13 illustrates a perspective view of shaping of the cylindrical filler of FIG. 12 in accordance with one embodiment.

FIG. 14 illustrates a perspective view of dies positioned on the shaped cylindrical filler of FIG. 13 in accordance with one embodiment.

FIG. 15 illustrates a perspective view of power wiring to the dies of FIG. 13 in accordance with one embodiment.

FIG. 16 illustrates a perspective view of power and data signal wiring to the dies of FIG. 13 in accordance with one embodiment.

FIG. 17 illustrates a perspective view of power, clock signal, and data signal wiring to the dies of FIG. 13 in accordance with one embodiment.

FIG. 18 illustrates a perspective view of an assembled LED bead device having a transparent or translucent outer layer in accordance with one embodiment.

FIG. 19 illustrates a perspective view of a flexible, interruptible radial bus passing through the central aperture of an LED bead device in accordance with one embodiment.

FIG. 20 illustrates a perspective view of notches interrupting two interruptible conductors of the flexible, interruptible radial bus of FIG. 19 in accordance with one embodiment.

FIG. 21 illustrates a perspective view of sealant or filler in the notches in the interrupted conductors of the flexible, interruptible radial bus of FIG. 20 in accordance with one embodiment.

FIG. 22 illustrates a perspective view of insulation removed from the conductors of the flexible, interruptible radial bus of FIG. 21, with the LED bead device positioned over the sealed or filled notches in accordance with one embodiment.

FIG. 23 illustrates a perspective view of soldering connecting the conductors of the flexible, interruptible radial bus to the LED bead device of FIG. 22 in accordance with one embodiment.

FIGS. 24-30 illustrate assembly and mounting of a two-part LED bead device on a flexible, interruptible radial bus in accordance with one embodiment.

FIG. 24 illustrates an isometric view of a two-part LED bead device in accordance with one embodiment.

FIG. 25 illustrates an isometric view of the two-part LED bead device of FIG. 24 with a four-wire flexible, interruptible radial bus in accordance with one embodiment.

FIG. 27 illustrates an isometric view of the two-part LED bead device of FIG. 24 assembled around the four-wire flexible, interruptible radial bus of FIGS. 26A-26B in accordance with one embodiment.

FIG. 28 illustrates an isometric view of shaping of the cylindrical exterior of the assembled two-part LED bead device of FIG. 27 and soldering of the two-part LED bead device to the four-wire flexible, interruptible radial bus in accordance with one embodiment.

FIG. 29 illustrates an isometric view of the assembled two-part LED bead device of FIG. 28 including SMD dies and power, data signal, and clock signal wiring to the dies in accordance with one embodiment.

FIG. 30 illustrates an isometric view of an assembled LED bead device having a translucent outer layer in accordance with one embodiment.

FIGS. 31-39 illustrate construction, assembly, and mounting of a castellated two-part radial mounted device on a flexible, interruptible radial bus in accordance with one embodiment.

FIG. 31 illustrates a perspective view of two parts of a castellated two-part radial mounted device in accordance with one embodiment.

FIG. 32 illustrates an exploded breakout perspective view of the castellated two-part radial mounted device of FIG. 31 in accordance with one embodiment.

FIGS. 33A-33B illustrate perspective views of the two parts of the castellated two-part radial mounted device of FIG. 32 including SMD dies and power, data signal, and clock signal wiring to the dies in accordance with one embodiment.

FIG. 34 illustrates a perspective view of the two parts of the castellated two-part radial mounted device of FIG. 33 positioned to be brought together around a four-wire flexible, interruptible radial bus with notches in interruptible conductors and insulation removed in accordance with one embodiment.

FIG. 35 illustrates a perspective view of the castellated two-part radial mounted device of FIG. 34 assembled around the four-wire flexible, interruptible radial bus of FIG. 34 in accordance with one embodiment.

FIG. 36 illustrates a perspective view of the two parts of the assembled castellated two-part radial mounted device of FIG. 35 soldered together and to the four-wire flexible, interruptible radial bus in accordance with one embodiment.

FIGS. 37A-37B illustrate perspective views of two parts of a different castellated two-part radial mounted device having fewer conductive metal pads in accordance with one embodiment.

FIG. 38 illustrates an exploded breakout perspective view of the castellated two-part radial mounted device of FIGS. 37A-37B in accordance with one embodiment.

FIG. 39 illustrates a perspective view of the two parts of the assembled castellated two-part radial mounted device of FIGS. 37A-37B soldered together and to the four-wire flexible, interruptible radial bus in accordance with one embodiment.

DETAILED DESCRIPTION

Figure 2:
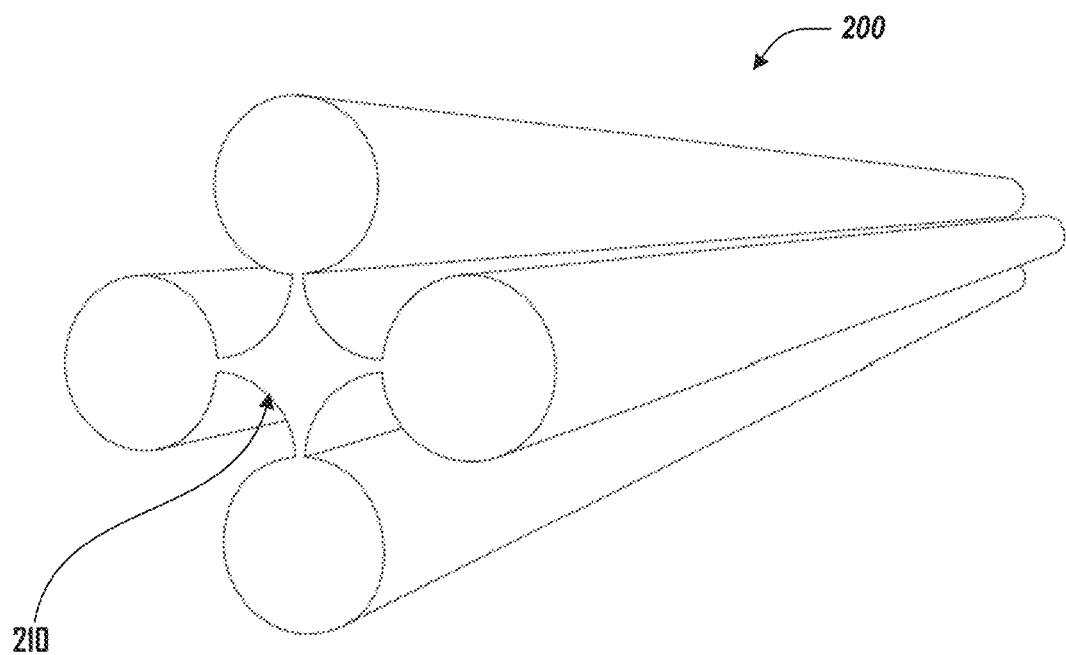
FIG. 2 illustrates a perspective view of an example four-wire radial bus layout with a center stabilizer.
Figure 3:
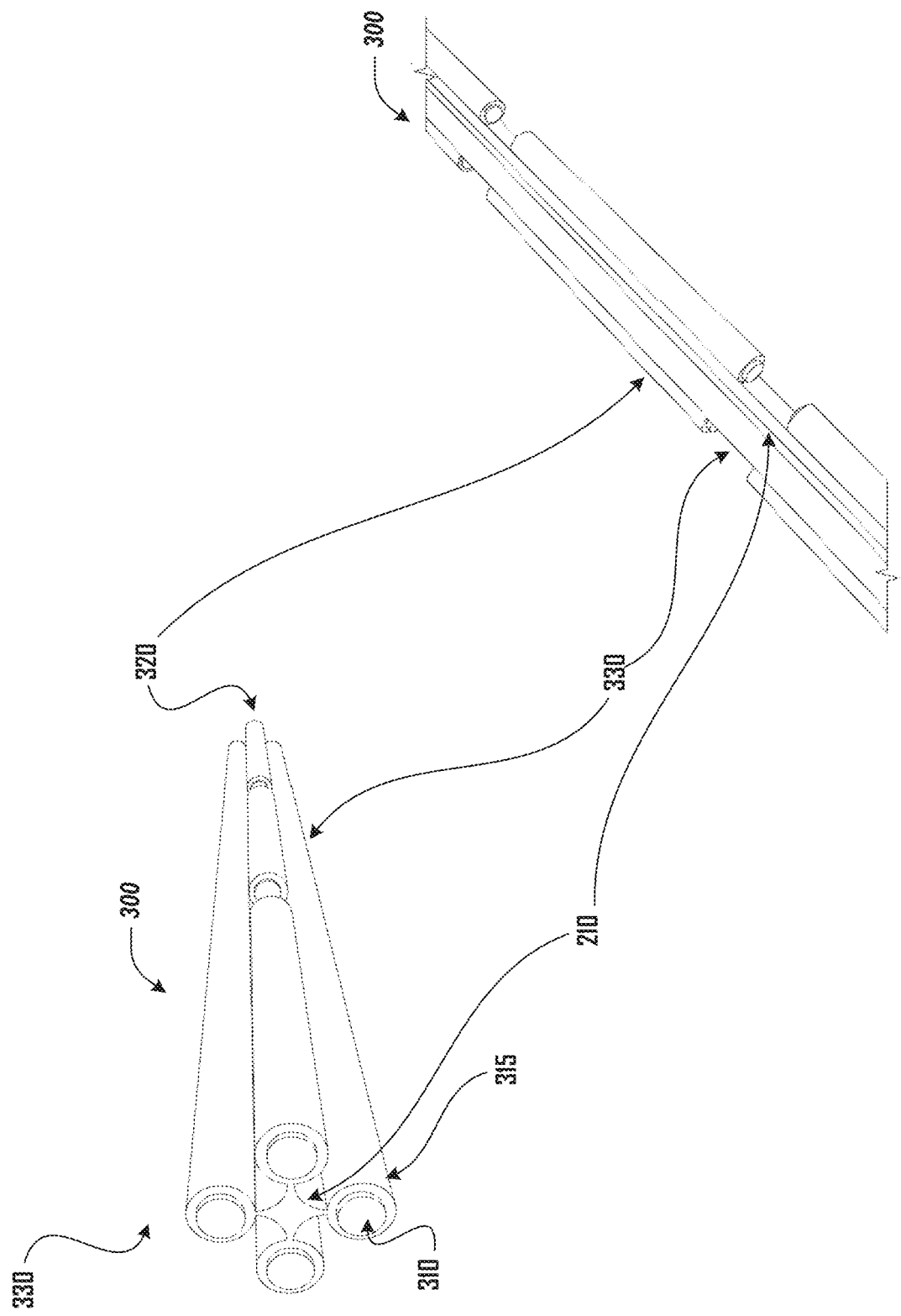
FIGS. 3A-3B illustrate perspective views of a four-wire radial bus showing conductors and cuts in interrupted path conductors in accordance with one embodiment.

This application discloses improved systems and methods of producing a flexible, interruptible radial bus for mounting addressable bead-like devices that can incorporate, for example, light-emitting diodes (LEDs) or other surface mount devices (SMDs).

The Specification utilizes the following definitions:

Radial—oriented around a central point or axis

Interruptible Bus—a bus that has the characteristic of providing access for the removal of a section of a conductor, e.g., configured so that a wire can be cut or notched by a tool or machine without cutting or otherwise affecting adjacent wires Stabilizer—device designed to prevent the movement of wires Device Chain—A series of devices connected in series with signal paths that support the delivery of electrical potential, timing and data signals along the chain Pass-Through Path—A bus path that passes electrical potential or signal down a bus unmodified and uninterrupted, e.g., a continuous wire Interrupted Path—A bus path that has interruptions along the length of the path, e.g., a discontinuous wire, whereby a device attached to the bus (e.g., to both sides of the path across an interruption in the bus) will take the responsibility of propagating the signal across the interruption to the next device on the bus. The signal being propagated may or may not be modified by the device.

Radial Mounted Device (RMD)—a multipart component having parts that join to mount around a radial bus or substrate The design of the flexible, interruptible radial bus is oriented towards the easy addition of cascading protocol devices along its length. Cascading protocol buses have pass-through and interrupted electrical paths running down the length of the bus. The pass-through paths typically carry electrical potential such as voltage and ground to all the devices on the bus, while the interrupted paths carry electrical signals such as clock and data down the length of the bus. The clock and/or data signals on the bus are specific to the particular protocol of the bus, but in a cascading bus, a device can receive the incoming clock and data signals and transmit a modified version of the signal down to the next participant on the bus.

For example, a cascading device protocol that utilizes a data train could transmit signals for three devices arranged as follows:

| Start Frame | Device 1 | Device 2 | Device 3 | End Frame |
|---|---|---|---|---|

In this example protocol, the first device on the bus will be exposed to the entire signal transmitted from the bus driver. The cascading nature of the protocol is exhibited in the fact that the first device on the bus will remove the data at the head of the train as the signal is propagated down the length of the bus. In order for the data train to be modified as it transits the bus, the electrical path for the data signal must be interrupted. The following is an example of the data train that will be passed on from Device 1 and proceed down the bus to the second device in the bus.

| Start Frame | Device 2 | Device 3 | End Frame |
|---|---|---|---|

And similarly, Device 2 will modify the data train by removing its data and sending subsequent data on to device number three.

| Start Frame | Device 3 | End Frame |
|---|---|---|

Example Advantages

The flexible, interruptible radial bus and bus-mounted devices of the present disclosure offer significant advantages over prior art bus and SMD devices. For example:

1. Improved range of motion over current flat form factor addressable bus designs.

2. An integrated radial center stabilizer positions wires outward (as compared to a bus without a center stabilizer) to a perimeter distance that makes interrupted path wires accessible for interruption along the length of the bus.

3. The stabilizer holds a perimeter of radial wires in relative position around a central point along its length to enable efficient installation of electronic devices along the bus, which better supports automated manufacturing of lengths of strung devices.

4. The stabilizer holds signal and power wires in the same relative positions along its length, allowing pass-through and signal wires to be oriented such that pass through wires can double as a separation or barrier for interrupted wires.

5. The integrated radial center stabilizer holds wires in position for forming electrical connections, such as soldered connections, to devices spread along the length of the bus.

6. The integrated radial center stabilizer can contain a grounding wire that can be used to reduce crosstalk between signal wires and enhance bus transmission speeds.

7. A one-part or two- or more-part "bead" surface mount device package, e.g., a radial mounted device (RMD), can be mounted around the bus and can utilize surface mount soldering techniques 8. Radial mounted devices can be specifically designed to be mounted on the bus over the bus path interruptions that facilitate the device operation.

9. In some embodiments, a radial mounted device has electrical connection sites or connectors such as castellations or pads on the ends that allow for, e.g., the soldering of input and output signals to the bus and that serve to help anchor the bead in place over the interrupted signal paths of the bus that serve the purposes of the bead device.

10. In some embodiments, a two- or more-part radial mounted device has castellations or pads at the edges where the two (or more) parts of the bead join together to facilitate the propagation of signals, voltage and ground potentials between the two sides and around the bead and additionally serve to help hold the sections or parts of the bead together.

Bus Features

One feature of flexible, interruptible radial bus is that it enables four ranges of motion for various types of addressable device buses while maintaining the ease of manufacturing benefits of the less flexible printed buses. The bus also allows for a new type of SMD device that is shaped like a bead, e.g., a radial mounted device (RMD) to be easily installed along the length of the bus. This new type of SMD device has the benefit of having a surface that extends around the bus so it has the potential to offer a greater visual field for light based devices.

The current flex print type of bus only allows for the installation of devices on one surface, and the bus only offers flexibility in the up-and-down direction along with some flexibility in a twisting direction. The flexible, interruptible radial bus is designed to still allow for the easy installation of special bead SMD devices or radial mounted devices along its length but also offers flexibility in the up, down, left and right directions or combinations thereof as well as flexibility in a twisting direction.

Another feature of the bus is that it intentionally exposes its pathways for interruption so that devices can be installed anywhere along its length. Current flex-print buses utilize chemical etching processes to create pads, pathways, and interruptions into a layer of copper on the surface of the flex-print in fixed patterns based on the pre-defined spacing of the devices to be installed along the length of the bus. The flexible, interruptible radial bus utilizes a center stabilizer that holds conductors in a fixed orientation and at fixed distances from the central axis of the bus. The stabilizer is proportioned with respect to the bus wires so as to provide access for a tool to remove sections of specific signal pathways at locations along the bus where bead devices will be installed. For example, the stabilizer puts an interrupted path wire in a position where it is spaced from surrounding wires so that a nipping tool or machine can cut or notch the wire without cutting other (e.g., adjacent) wires.

The center stabilizer does not have to run the entire length of the bus. It can run the whole length, be injected or otherwise positioned at regular or intermittent intervals, or be removed from the center at various (e.g., fixed or irregular) intervals in between the installed beads or devices to increase flexibility.

A center conductor can be added to the radial bus between the signaling wires, e.g., inside the center stabilizer. For example, such a conductor can serve as a ground placed between signaling wires to minimize or reduce crosstalk between the signaling wires.

Bead Features

A bead device can be molded in one piece, such as in place at a site on the bus (e.g., over a cut in an interrupted path wire) or threaded onto the bus.

A two- or more-part bead semiconductor device is, in some embodiments, a semiconductor device that is designed to be manufactured as two or more parts that will mate together and fit to the flexible, interruptible radial bus or any other bus or substrate that the bead can fit around and that provides matching pads around the circumference of the bus or substrate. In the case of the flexible, interruptible radial bus, the matching pads are places where the bus pathways have been exposed by, e.g., removing the insulation of the pass-through path and/or interrupted path wires, and so the pads of the bead device can contact and be soldered to the pads or conductors of the installation site or mounting location. Where the bead device is configured for surface mount soldering around the periphery of the installation site or mounting location, the pads or conductors need to maintain fairly stable position during the installation process.

The bead device may provide solder pads at each end of the bead so as to allow for input and output signals on each side of the bead as well as interrupted paths that are surrounded by the bead to which the bead can be soldered on each end.

The two or more parts of a multi-part bead device may become one connected electronic device such that signals are passed and propagate between the parts of the device via castellations or pads that mate (and can be soldered together to ensure electrical and physical connectivity) at the surface where the parts of the device join together.

Example Bead Installation

Beads can be installed at any location along the bus, keeping in mind that putting the beads too close in proximity can reduce the flexibility of the bus. To install a bead onto the bus, in one embodiment, the installation site or mounting location is chosen. The signals that require interruption for the bead to operation properly are nipped or cut using a tool that removes a specific length of the signal path from the conductor. A portion of the outer insulation is removed from the surface of the pass-through path bus wires and/or the interrupted path bus wires where the bead ends will be soldered to the bus. The two halves of the bead (for example) are properly positioned with respect to signal location around the bus over the interruption site. The two halves of the bead can connect mechanically (e.g., having a protrusion and detent that lock or snap together). The two halves of the bead can have a glue or sealant coated to the inner surface (e.g., taking care not to coat solderable areas of the bead). The bead can then be held together while the bead is soldered to the bus on the ends and also soldered together in the center at then signal connection sites at the joint of the two bead halves. Once the bead is soldered, there is enough mechanical force to hold the bead in place while any sealants or glues dry that might be used to further add strength to the joining of the two halves of the bead.

Reference is now made in detail to the description of the embodiments as illustrated in the drawings. While embodiments are described in connection with the drawings and related descriptions, there is no intent to limit the scope to the embodiments disclosed herein. On the contrary, the intent is to cover all alternatives, modifications and equivalents. In alternate embodiments, additional devices, or combinations of illustrated devices, may be added to, or combined, without limiting the scope to the embodiments disclosed herein. For example, the embodiments set forth below are primarily described in the context of wire-mounted LEDs. However, these embodiments described herein are illustrative examples and in no way limit the disclosed technology to any particular size, construction, or application.

The phrases "in one embodiment," "in various embodiments," "in some embodiments," and the like are used repeatedly. Such phrases do not necessarily refer to the same embodiment. The terms "comprising," "having," and "including" are synonymous, unless the context dictates otherwise. As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The disclosed flexible, interruptible radial bus and bus-mounted bead devices can take a variety of form factors. FIGS. 1A through 36 illustrate several different arrangements and designs. The illustrated buses and bead devices are not an exhaustive list; in other embodiments, a bus or a bead device could be formed in different arrangements. However, it is not necessary to exhaustively show such optional implementation details to describe illustrative embodiments.

FIGS. 1A-1D illustrate clocked cascading device chain wiring diagrams.

FIG. 1A illustrates a diagram of a clocked cascading device chain that utilizes a 4-wire data bus. There are pass-through paths on the bus that the devices 160 tap into for power (or voltage) 130 and ground 140, and there are interrupted paths on the bus for cascading data signals 110 and clock signals 120. The bus thus supports a clocked cascading data device train.

It is also possible to have a device chain that utilizes a different number of electrical paths along the bus, e.g., three. FIG. 1B illustrates a diagram of a 3-path device chain. There are pass-through paths on the bus that devices tap for power (or voltage) 130 and ground 140 and there is a single interrupted path on the bus that carries a more precisely timed (or otherwise synchronized) data signal 110. Synchronization by, e.g., timing of the data signal 110 eliminates the need for the clock signal 120 on the bus.

It is also possible to have cascading buses that propagate data trains to and from the devices along the bus, e.g., bidirectionally. FIG. 1C illustrates a diagram of a clocked device chain with bidirectional paths for data signal 110 and reverse data signal 150.

Cascading bus protocols can be utilized to drive multiple devices performing the same function that are wired in parallel. An example of such a device would be an LED bead device 100 that has 4 LED devices 160, two on each half of the bead packages. FIG. 1D illustrates a diagram of two bead LED devices 100. Each bead 100 has 4 LED devices 160 wired in an addressable bus. The power (or voltage) 130 and ground 140 are wired to each led device 160 on the bead 100. The incoming clock signal 120 is routed to the clock-in of each LED device 100 on the bead and the outgoing clock signal 125 is routed back to the bus to be passed on to the next device 105 in the chain. The incoming data signal 110 is routed to each LED device 160 on the bead and the outgoing data signal 115 is taken from a single device 160 on the bead 100 and routed back to the bus to be passed on the next device 105 in the chain.

FIG. 2 illustrates a cutaway perspective view of an example four-wire radial bus 200 layout with a central binder or center stabilizer 210. The present disclosure encompasses various center stabilizer 210 arrangements and shapes, e.g., square or diamond, circular, hollow, plus-sign shaped, spiral or helical, etc. In various embodiments, the center stabilizer 210 is attached (e.g., molded) to the insulation covering the conducting wires of the bus. In some embodiments, the center stabilizer includes a wire for conduction or shape-holding.

FIGS. 3A-3B illustrate perspective views of a four-wire radial bus 300 showing conductor wires 310 and cuts 325 in interrupted path conductors 320 in accordance with one embodiment. For clarity, the conductor wires 310 in the interrupted path conductors 320 are shown extending beyond their insulation 315. FIG. 3A illustrates the continuous electrical path of pass-through conductors 330 and the interrupted electrical path of interrupted path conductors 320. FIG. 3B shows how the center stabilizer 210 can position interrupted path conductors 320 to allow them to be cut 325 without affecting pass-through conductors 330.

Figure 4:
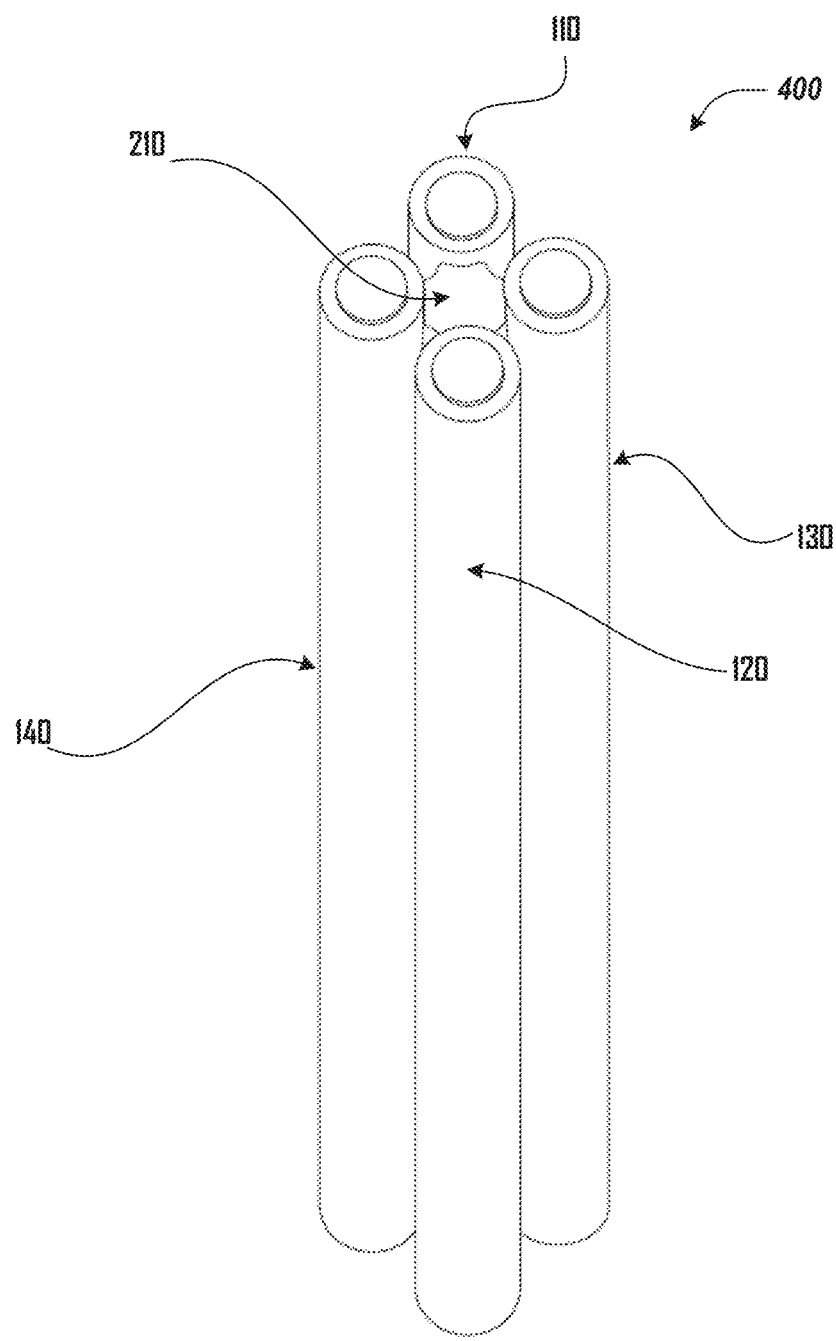
FIG. 4 illustrates an isometric view of a four-wire radial bus with a cutaway end in accordance with one embodiment.

FIG. 4 illustrates an isometric view of a four-wire radial bus 400 in accordance with one embodiment. The center stabilizer 210 has a different profile than that shown in FIGS. 2 and 3A-3B. A cutaway end shows conductors for, starting at the top and proceeding clockwise, data signals (e.g., blue) 110, power or voltage (e.g., red) 130, clock signals (e.g., green) 120, and ground (e.g., black) 140.

Figure 5:
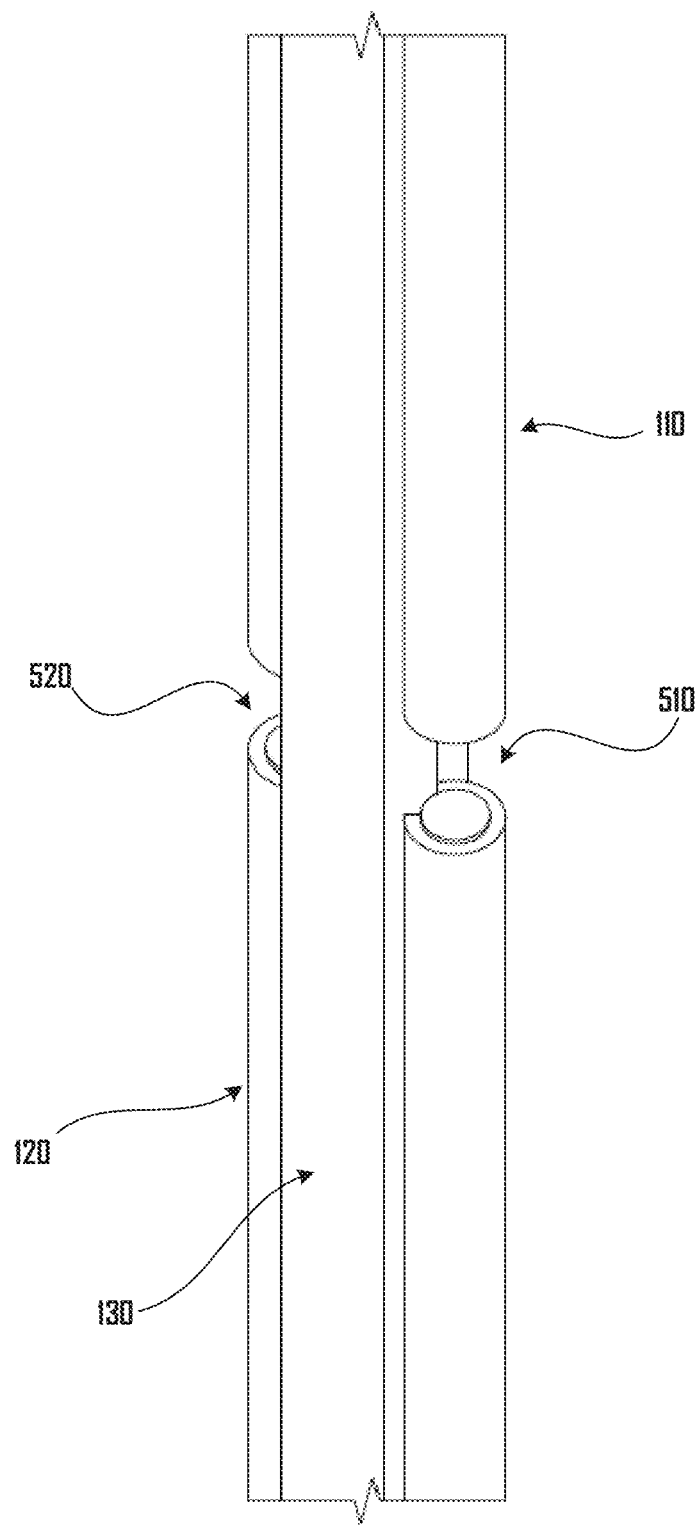
FIG. 5 illustrates an isometric view of a four-wire radial bus showing cuts in interrupted path conductors in accordance with one embodiment.

FIG. 5 illustrates an isometric view of a four-wire radial bus showing cuts 510, 520 in interrupted path conductors for data signal 110 and clock signal 120 in accordance with one embodiment. In this illustration, the red wire for power or voltage 130 in the left foreground and the black wire for ground 140 in the right background are pass-through conductors, and the blue wire for data signal 110 in the right foreground and the green wire for clock signal 120 in the left background are interrupted path wires.

Figure 6:
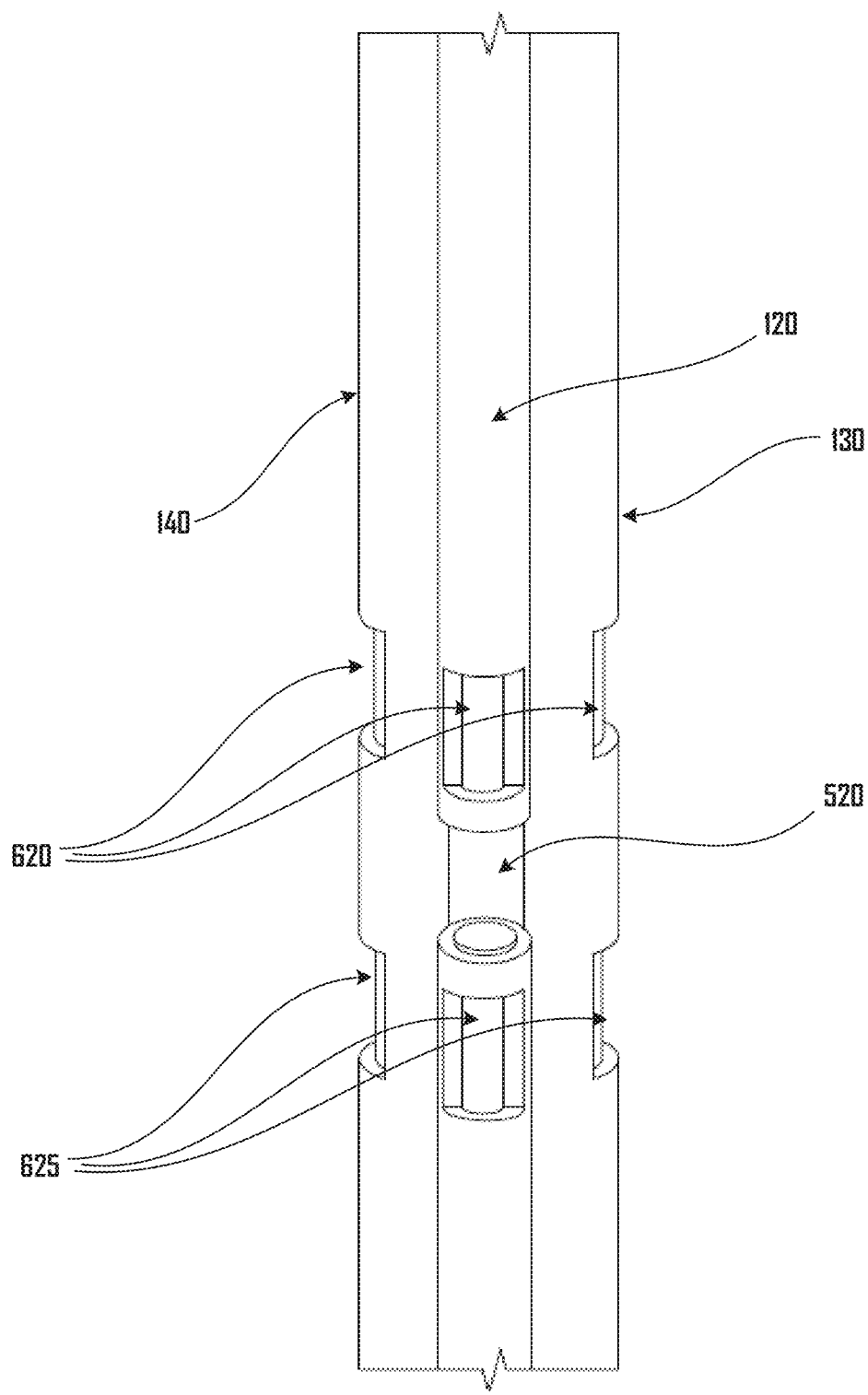
FIG. 6 illustrates an isometric view of a four-wire radial bus showing cuts in interrupted path conductors and insulation removed in accordance with one embodiment.

FIG. 6 illustrates an isometric view of a four-wire radial bus showing cuts 510, 520 in interrupted path conductors for data signal 110 and clock signal 120 and insulation removed in accordance with one embodiment. In the illustrated embodiment, insulation has been stripped at insulation cuts 620, 625 from each of the conductors for clock signal 120, power or voltage 130, and ground 140 shown to either side of the interruptions or cuts 510, 520 in the interrupted path wires (e.g., the green wire for clock signals 120 shown in the center). Insulation is stripped in corresponding locations along the pass-through path wires for power or voltage 130 and ground 140. For clarity in this example, the insulation cuts 620, 625 in the insulation are depicted as separate from the interruptions, although this is not required. In some embodiments, insulation cuts 620, 625 are smaller, larger, merged with interruptions, or in different numbers (e.g., only one insulation cut 620 for a pass-through wire at a given mounting location).

Figure 7B:
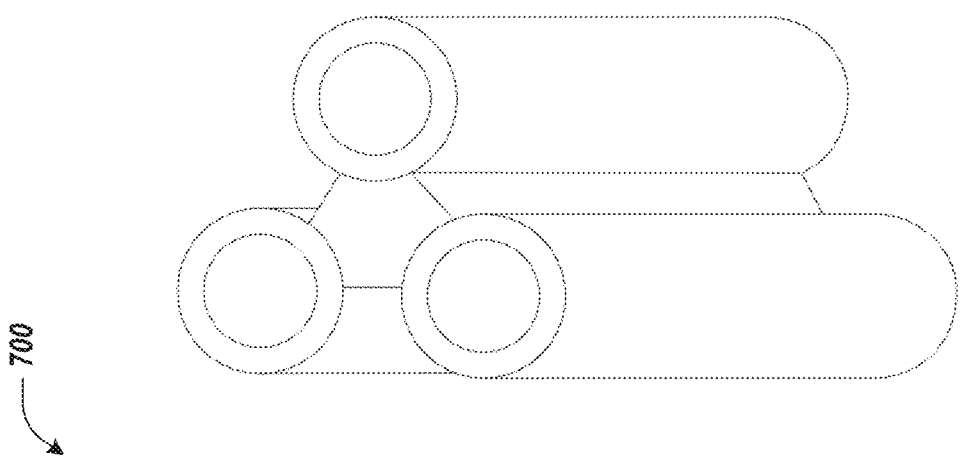
FIGS. 7A-7B illustrate an end view and an isometric view of a three-wire radial bus in a triangular arrangement in accordance with one embodiment.
Figure 7A:
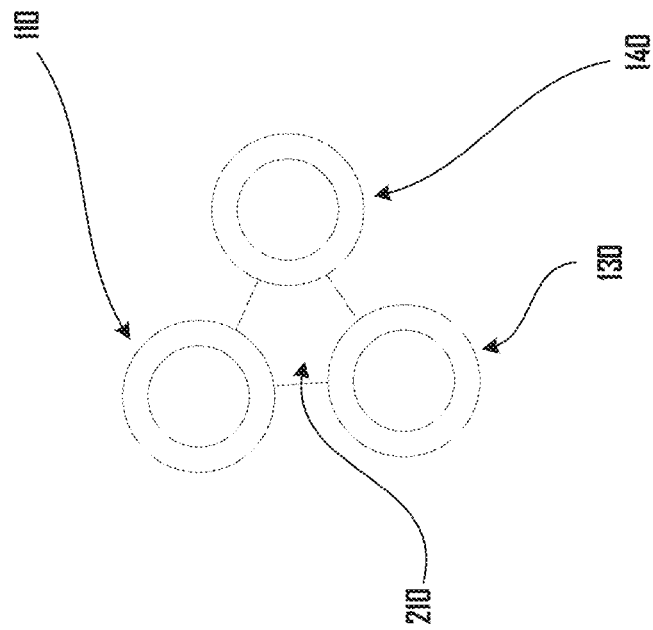

FIGS. 7A-7B illustrate an end view and an isometric view of a three-wire radial bus 700 in a triangular arrangement in accordance with one embodiment. FIG. 7A shows an example radial arrangement of three conductor wires with a center stabilizer 210 having a broad connection to each wire. FIG. 7B shows the three conductors (e.g., blue data signal 110 or green clock signal 120, black ground 140, and red voltage 130) with a cutaway end profile.

FIGS. 8A-8B illustrate an end view and an isometric view of a five-wire radial bus 800 in a pentagonal arrangement in accordance with one embodiment. FIG. 8A shows an example radial arrangement of five conductor wires with a center stabilizer 210 having a broad connection to each wire. FIG. 8B shows the five conductors (e.g., green clock signal 120, blue data signal 110, red voltage 130, brown reverse data signal 150, black ground 140) with a cutaway end profile.

Figure 9:
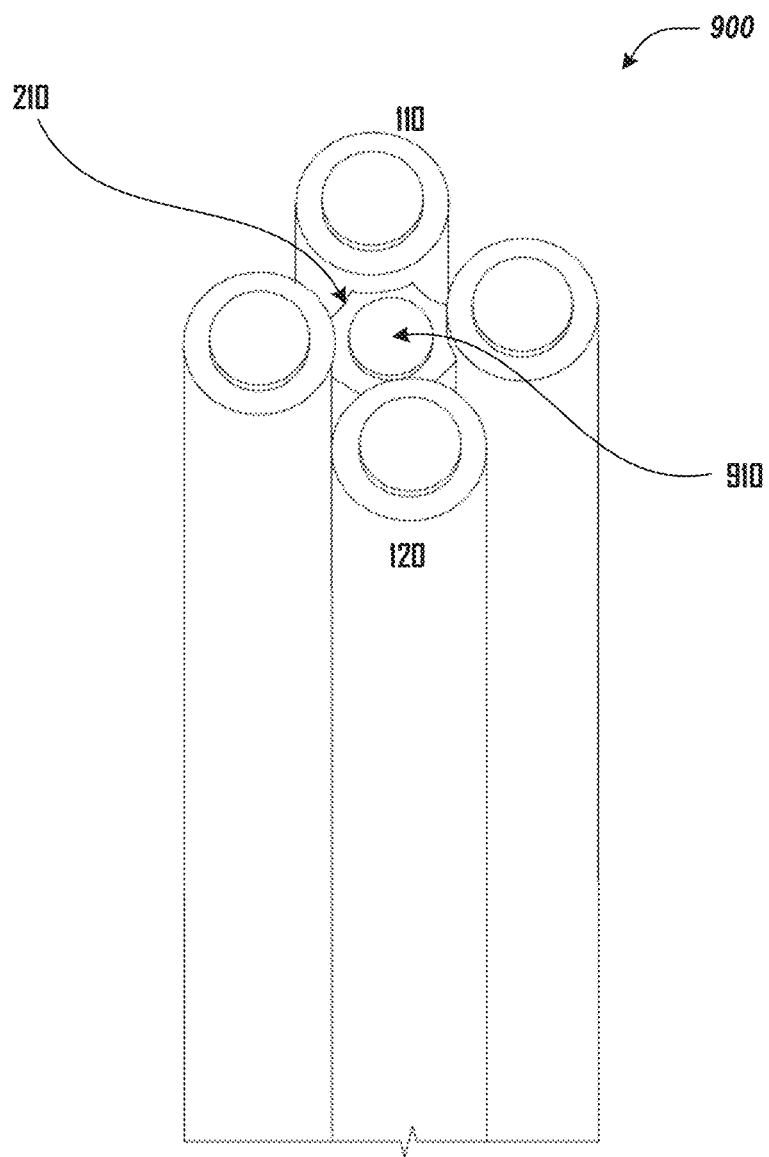
FIG. 9 illustrates an isometric view of a five-wire radial bus in a quincunx arrangement with a center conductor in accordance with one embodiment.

FIG. 9 illustrates an isometric view with a cutaway end showing conductors of a five-wire radial bus 900 in a quincunx arrangement with a center conductor 910 in accordance with one embodiment. For example, such a center conductor 910 can serve as a ground placed between wires for data signal 110 and clock signal 120 to minimize or reduce crosstalk between the signaling wires.

Figure 10:
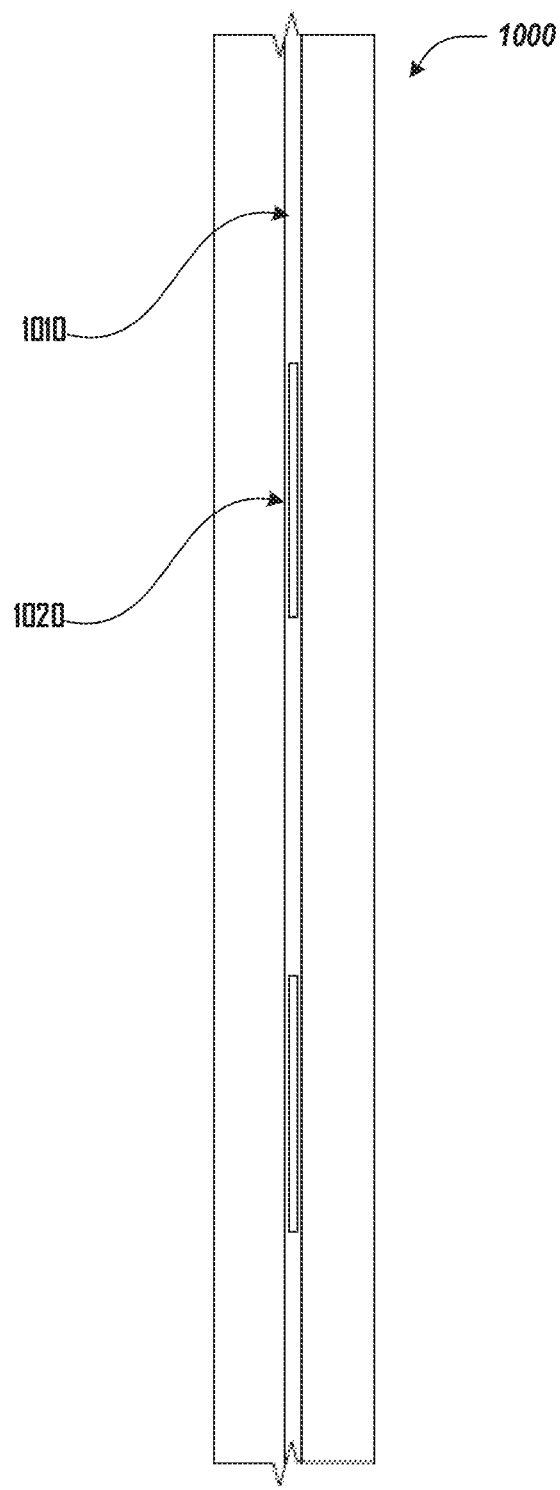
FIG. 10 illustrates a side view of an example radial bus having an intermittent center binder or stabilizer.

FIG. 10 illustrates a side view of an example radial bus 1000 having an intermittent central binder or center stabilizer 1010. The center stabilizer 1010 is alternately present and absent along the length of the bus 1000, leaving spaces 1020 between the conducting wires. This can increase flexibility of the bus, allow for insertion of devices or objects between the wires, lighten the bus, permit securing the bus with wire ties, etc. The center stabilizer can be added to or removed from the wires (e.g., injected) or otherwise positioned at intervals. Intervals may variously be regular or irregular, fixed or intermittent.

FIGS. 11-18 illustrate construction of a radial mounted device such as an LED bead device 1100 in accordance with one embodiment.

Figure 11:
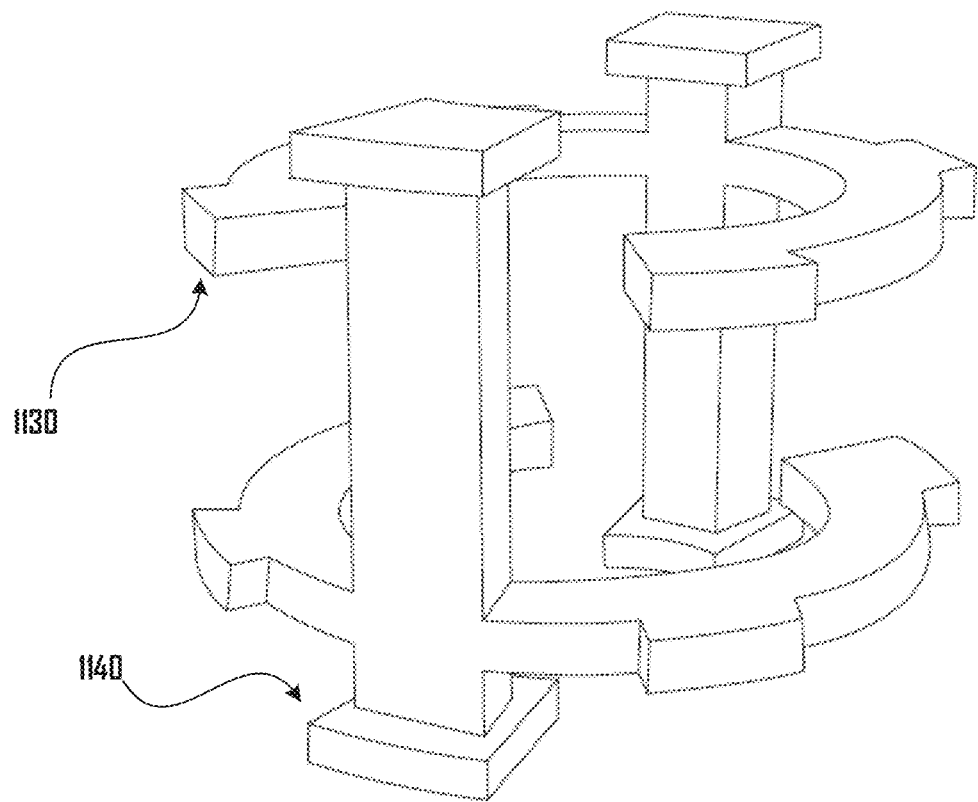
FIGS. 11-18 illustrate construction of a radial mounted device such as an LED bead device in accordance with one embodiment.

FIG. 11 illustrates a perspective view of an LED bead device's 1100 inner conductive elements 1130, 1140 in accordance with one embodiment. One of the conductive elements 1130 in this example is configured to transmit voltage or power, and the other 1140 is configured to connect to ground potential. The conductive elements are arranged to connect to a wire for voltage 130 and a wire for ground 140, respectively, and allow SMDs to easily connect to power and ground with minimal or no additional wiring.

Figure 12:
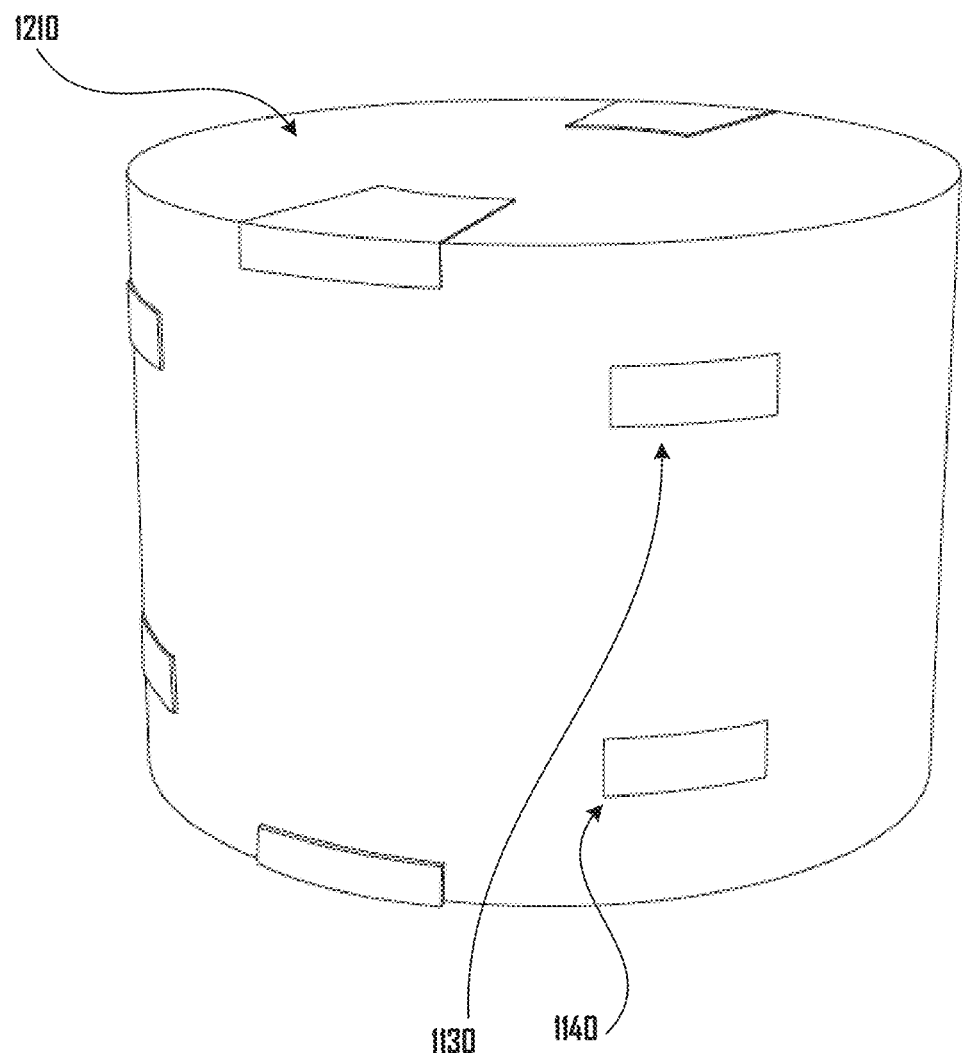

FIG. 12 illustrates a perspective view of cylindrical filler 1210 around the inner conductive elements 1130, 1140 of FIG. 11 in accordance with one embodiment. The filler 1210 may be any non-conductive or insulating material, e.g., foam, glass, plastic, silicone sealant, etc. It may be of any hardness or character, such as rigid, soft, moldable, pliant, elastic, etc. The body material or filler 1210 in the illustrated example is configured to be shapeable and sufficiently sturdy to allow mounting of SMDs. The conductive elements 1130, 1140 of FIG. 11 are exposed at various positions around and through the cylindrical filler 1210.

Figure 13:
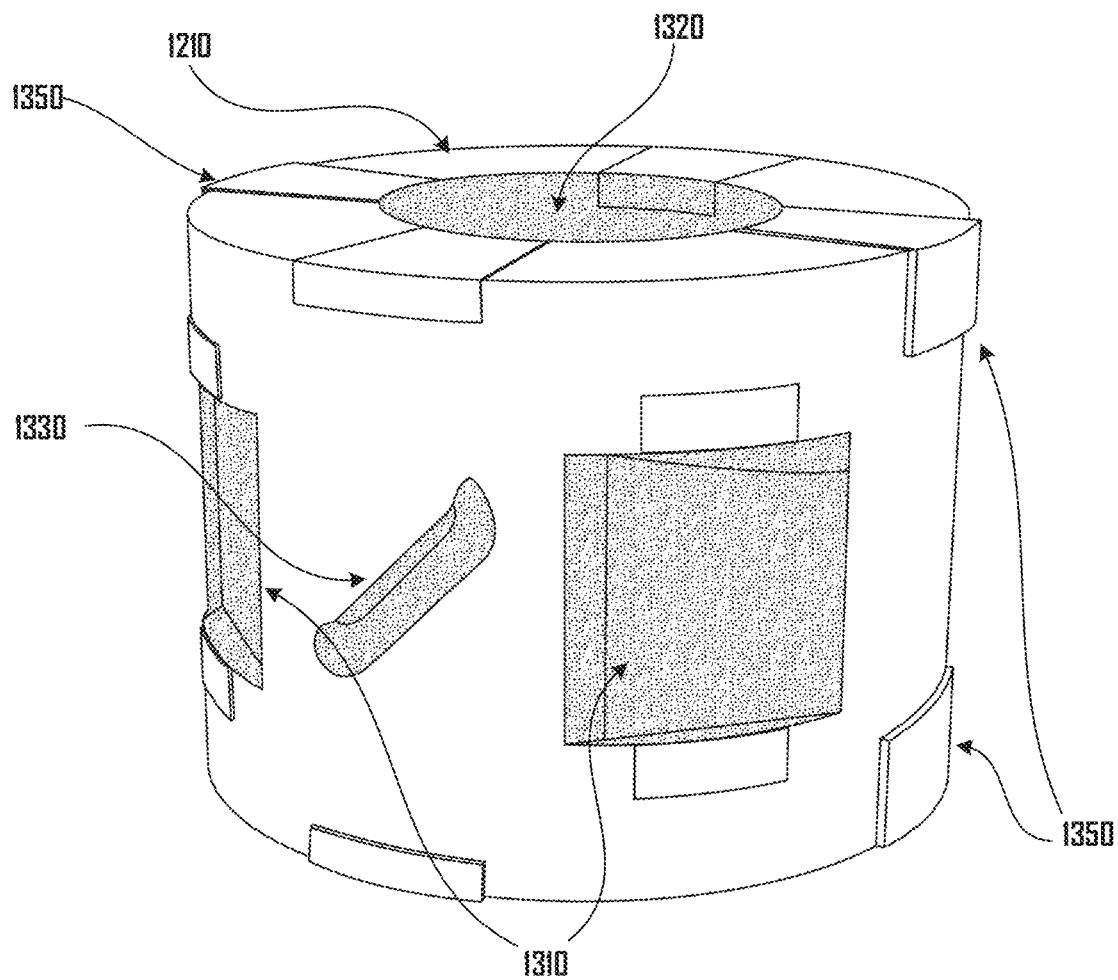

FIG. 13 illustrates a perspective view of shaping of the cylindrical filler 1210 of FIG. 12 in accordance with one embodiment. The material of filler 1210 may be shaped by tooling, heat, pressure, etc., or desired shapes may be molded in to begin with, e.g., by injection molding. In the illustrated example, the shaping includes external flat areas 1310 for mounting SMDs, an internal aperture 1320 through the bead device for bus wires to pass through, and an angled valley 1330 for passing one wire below another. In addition, conductive pads 1350 are attached to the filler. In this example, the conductive pads 1350 are to connect data signal 110 and clock signal 120 wiring.

Figure 14:
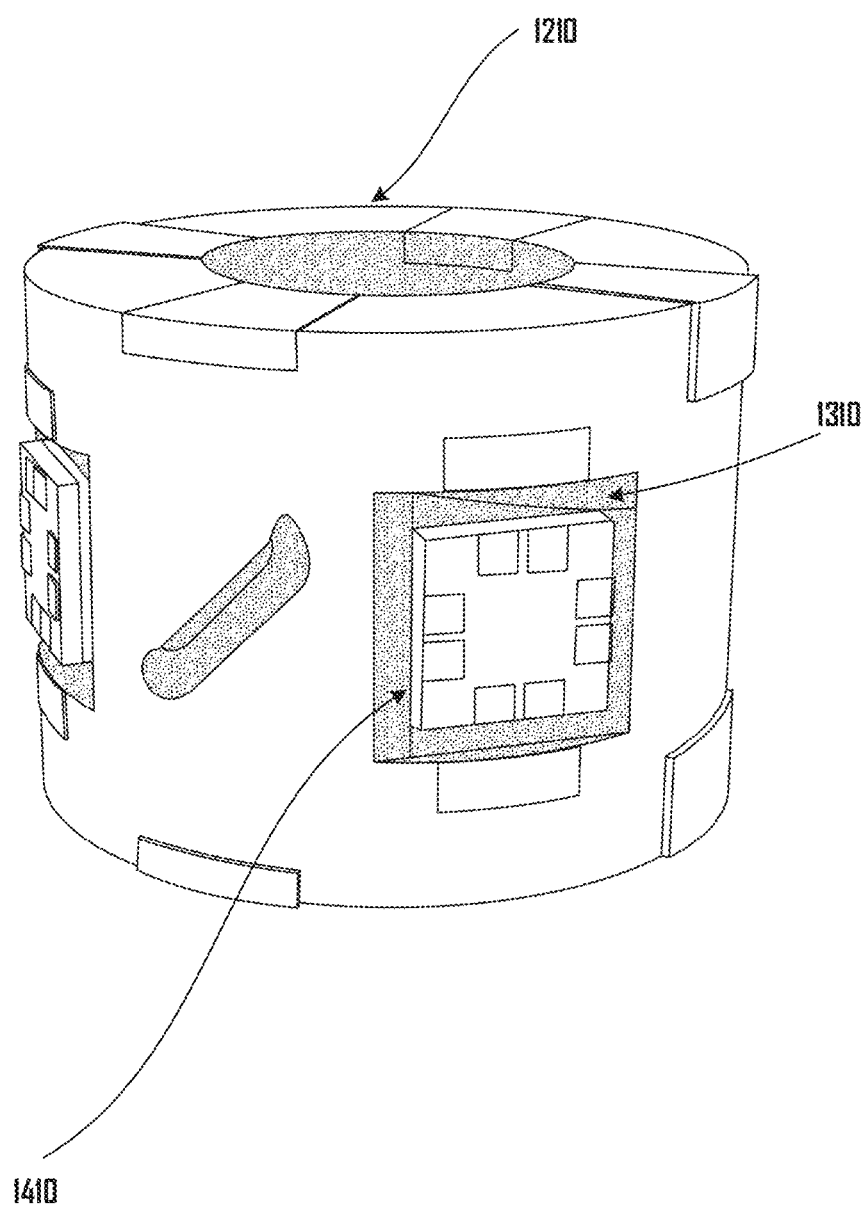

FIG. 14 illustrates a perspective view of dies 1410 positioned on the shaped cylindrical filler 1210 flat areas 1310 of FIG. 13 in accordance with one embodiment. A die 1410 is positioned on each of the flat areas 1310 for mounting SMDs.

Figure 15:
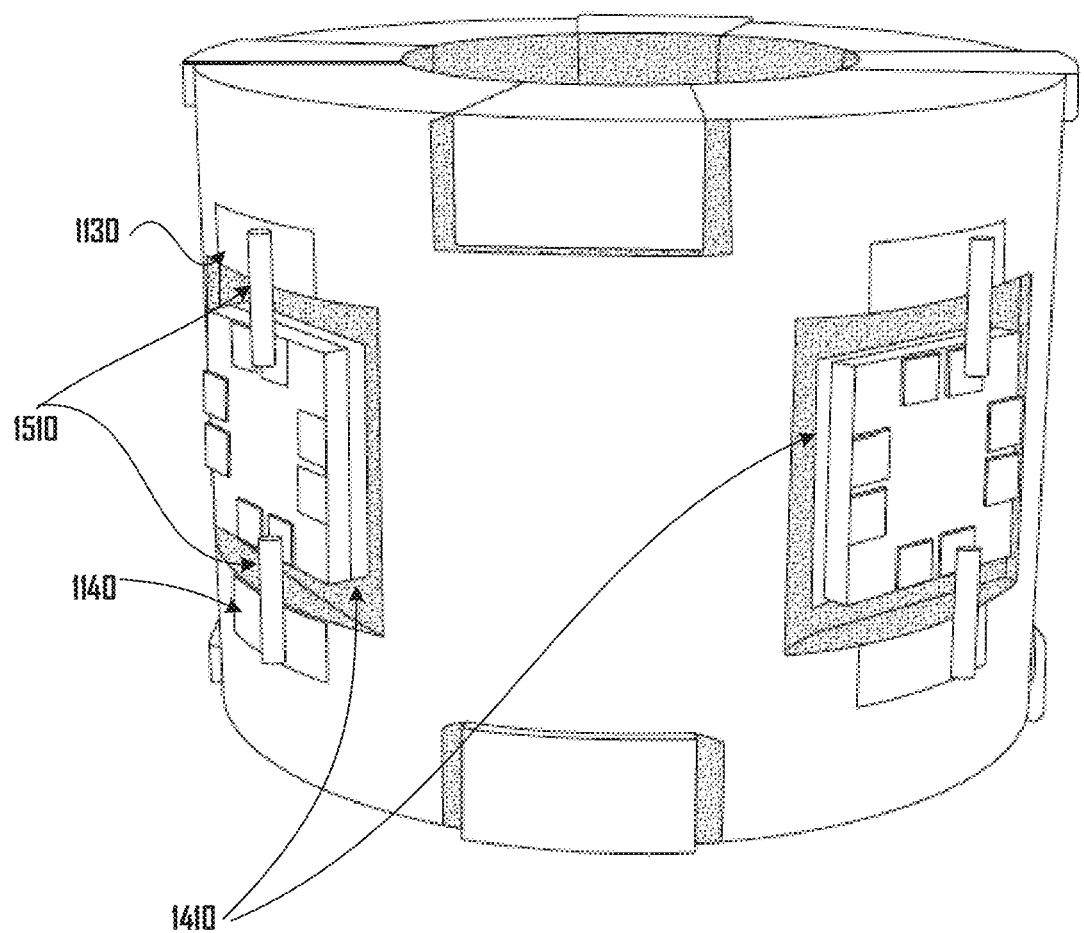

FIG. 15 illustrates a perspective view of power wiring to the dies 1410 of FIG. 14 in accordance with one embodiment. The view of FIG. 15 is rotated approximately 45 degrees from the view of FIG. 14. Each die has short leads 1530, 1540 connecting the die 1410 to the conductive elements 1130, 1140 of FIG. 11 to provide power (voltage) 130 and ground 140 connections.

Figure 16:
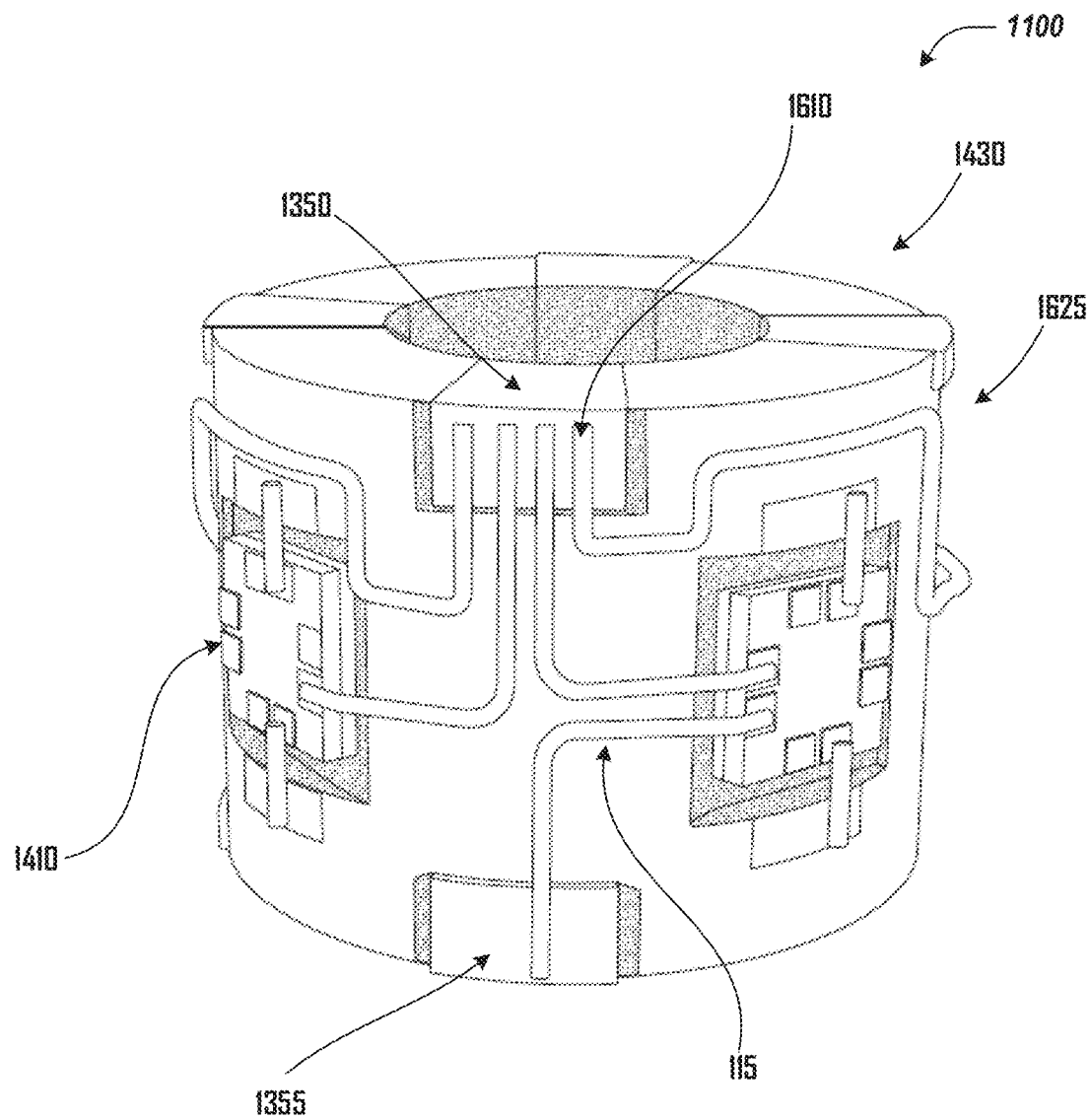

FIG. 16 illustrates a perspective view of power and data signal wiring to the dies 1410 of FIG. 14 in accordance with one embodiment. The view of FIG. 16 is rotated approximately 180 degrees from the view of FIG. 15. In this illustration, a conductive pad 1350 for a data signal 110 is connected by four small lead wires 1610 to the dies 1410 around the bead device 1100. An outgoing data signal 115 from one of the dies 1410 is connected by a lead wire 1615 to a conductive pad 1355 on the other side of the device. Thus, the data signal 110 on an interrupted path is capable of being transmitted to each die 1410 on the bead device 1100, and the next (e.g., altered) signal 115 can be transmitted to the next device (e.g., the next bead) in the chain.

Figure 17:
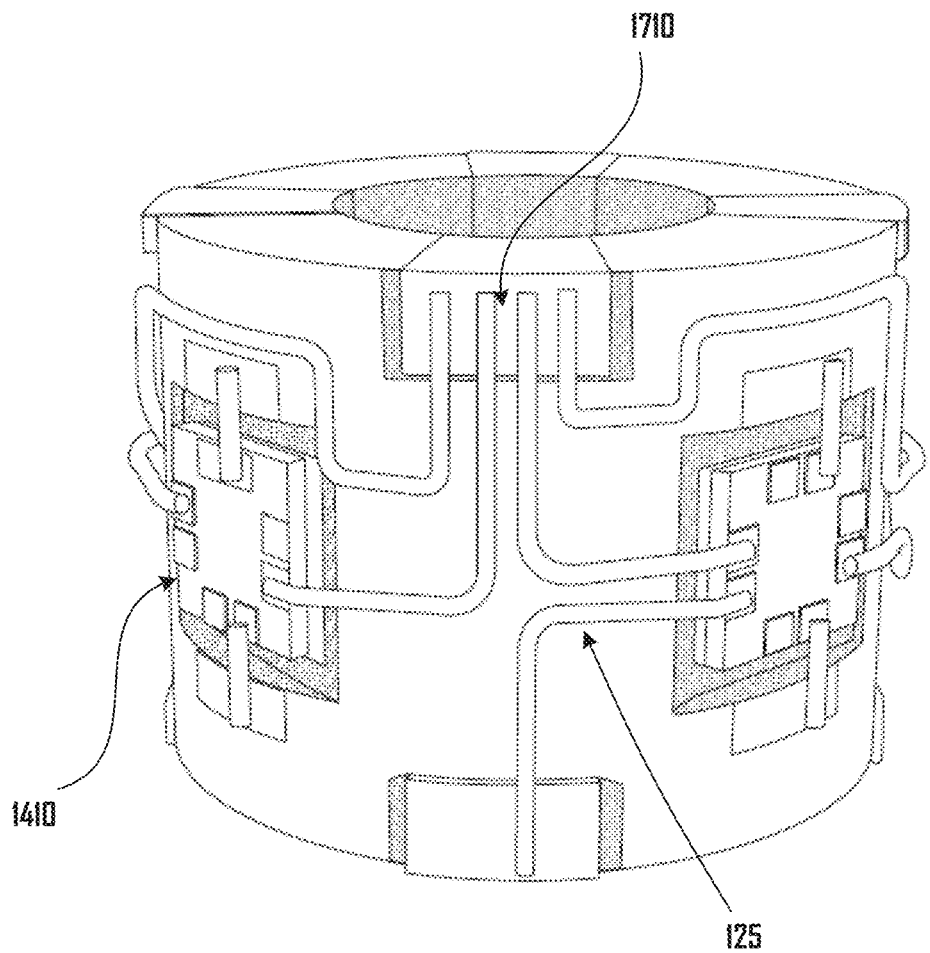

FIG. 17 illustrates a perspective view of power, clock signal, and data signal wiring to the dies 1410 of FIG. 14 in accordance with one embodiment. The view of FIG. 17 is rotated approximately 180 degrees from the view of FIG. 16, providing an orientation similar to FIG. 15. The clock signal lead wiring 1720, 1725 is laid out similarly to the data signal lead wiring 1610, 1615 of FIG. 16.

Figure 18:
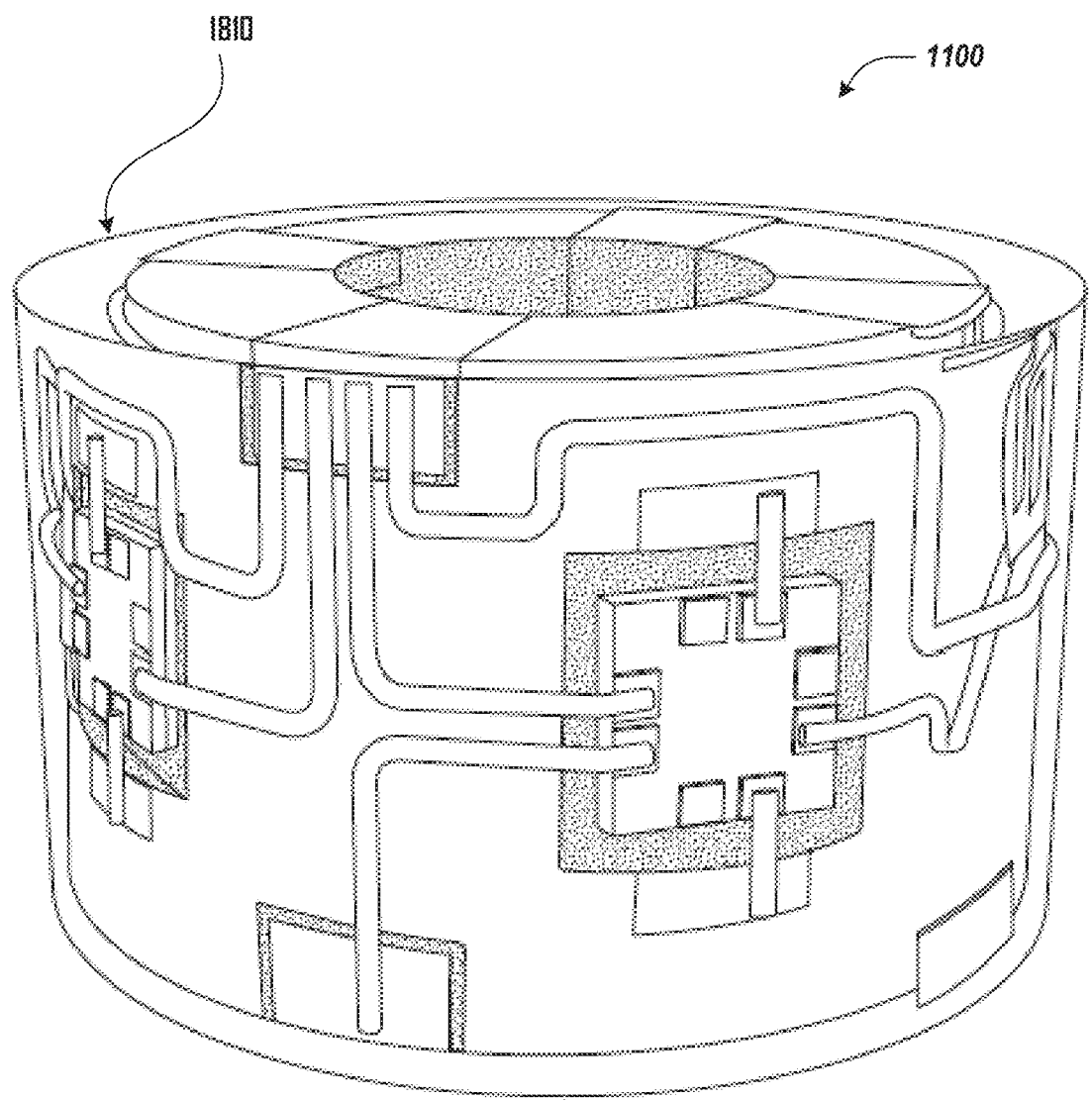

FIG. 18 illustrates a perspective view of an assembled LED bead device 1100 having a transparent or translucent outer layer 1810 in accordance with one embodiment.

FIGS. 19-23 illustrate mounting and connection of an LED bead device on a flexible, interruptible radial bus in accordance with one embodiment.

Figure 19:
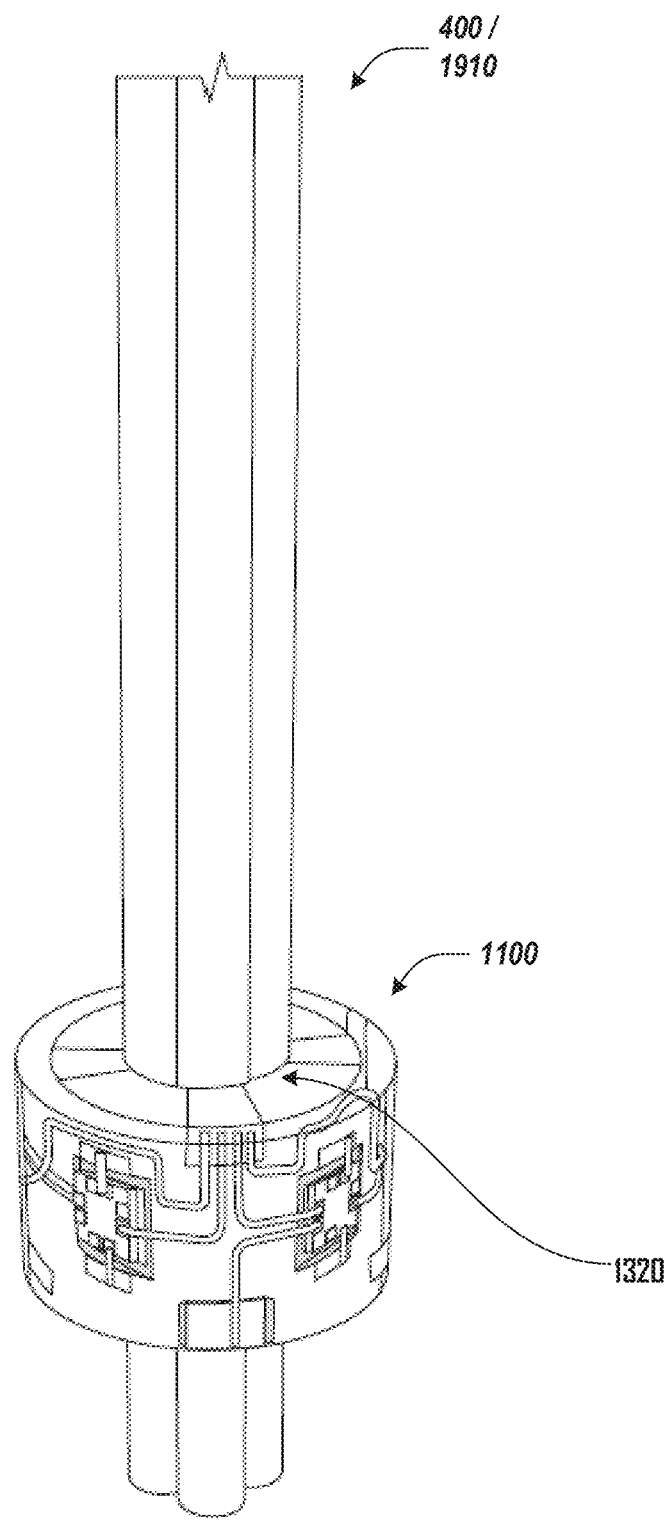
FIGS. 19-23 illustrate mounting and connection of an LED bead device on a flexible, interruptible radial bus in accordance with one embodiment.

FIG. 19 illustrates a perspective view of a flexible, interruptible radial bus 400 passing through the central aperture 1320 of the LED bead device 1100 of FIG. 18 in accordance with one embodiment. In this illustration, the bead 1100 is threaded onto the bus 400 as a decorative bead might be on a string. The four conductive pads of the bead device 1100 (including the externally visible portions of the inner conductive elements 1130, 1140 of FIG. 11, and the added conductive pads 1350 of FIG. 13) are aligned next to their respective conductive wires.

Figure 20:
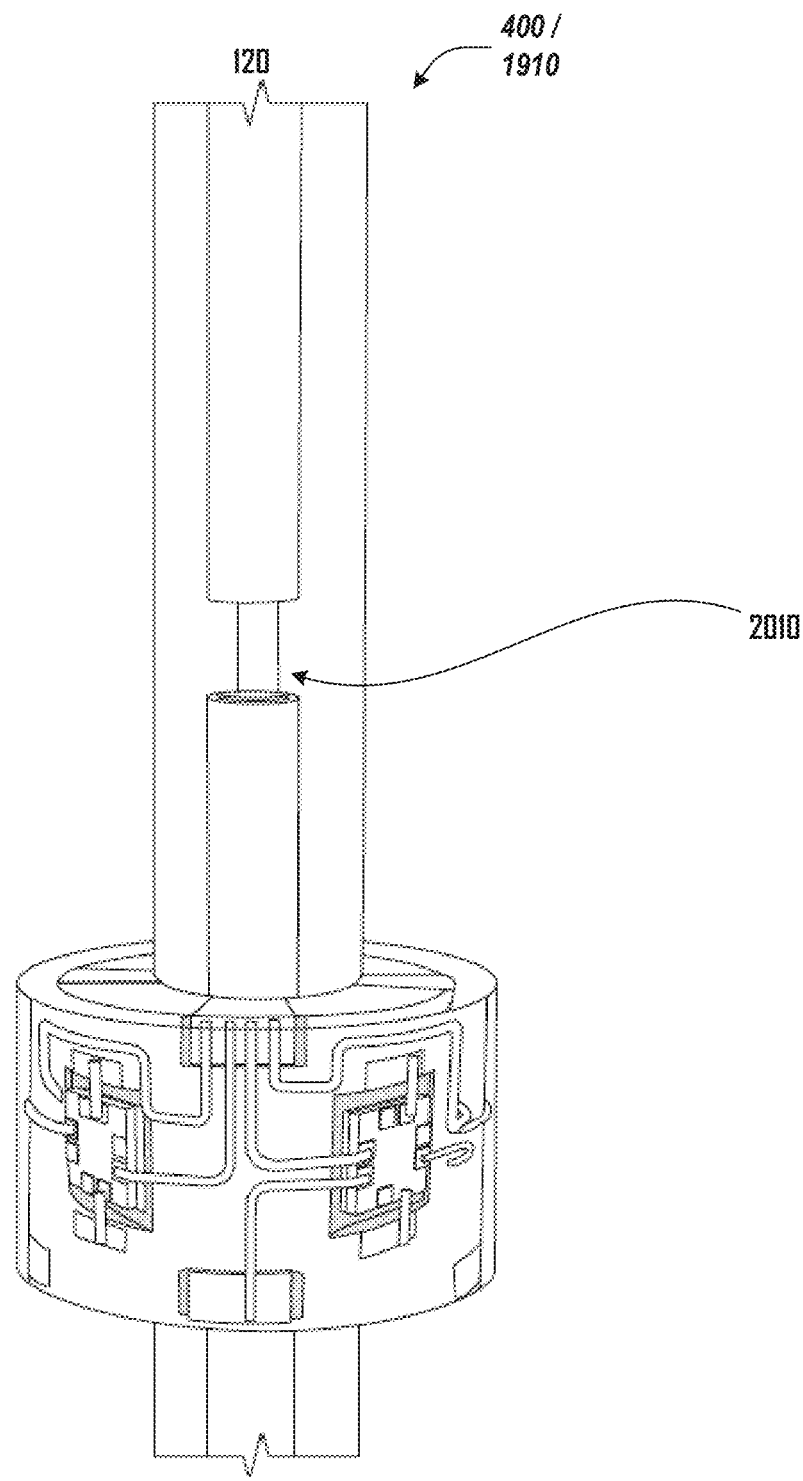

FIG. 20 illustrates a perspective view of notches 2010 interrupting two interruptible conductors of the flexible, interruptible radial bus 400 of FIG. 19 in accordance with one embodiment. In particular, the front wire (e.g., the green wire for clock signal 120) and the oppositely disposed back wire (e.g., the blue wire for data signal 110) are notched, forming interruptions in the interruptible path conductors).

Figure 21:
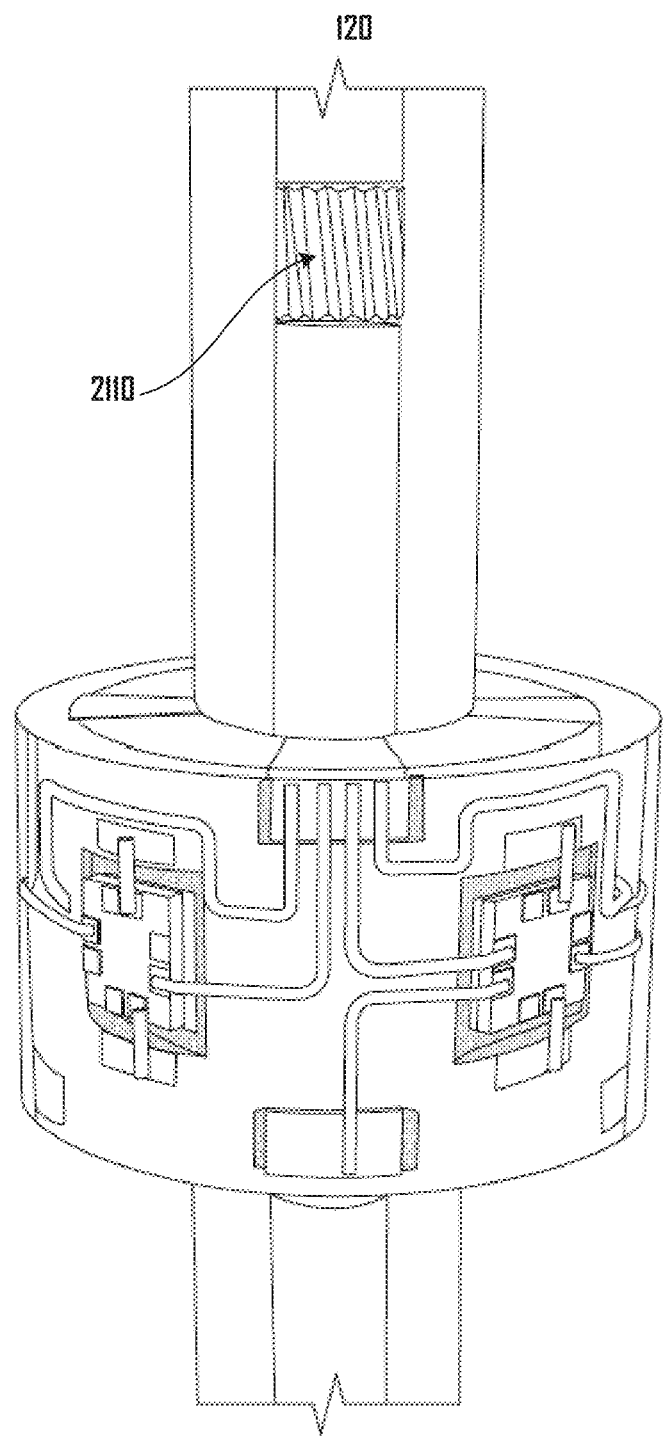

FIG. 21 illustrates a perspective view of sealant or filler 2110 in the notches 2010 in the interrupted conductors of the flexible, interruptible radial bus 400 of FIG. 20 in accordance with one embodiment. The sealant or filler 2110 may be, for example, a weather sealer, a corrosion preventant, or an electrical insulator. Sealing the notches is optional, depending on the application, the geometry of the interruption, and the devices to be attached. Air may form a sufficiently insulative gap filler.

Figure 22:
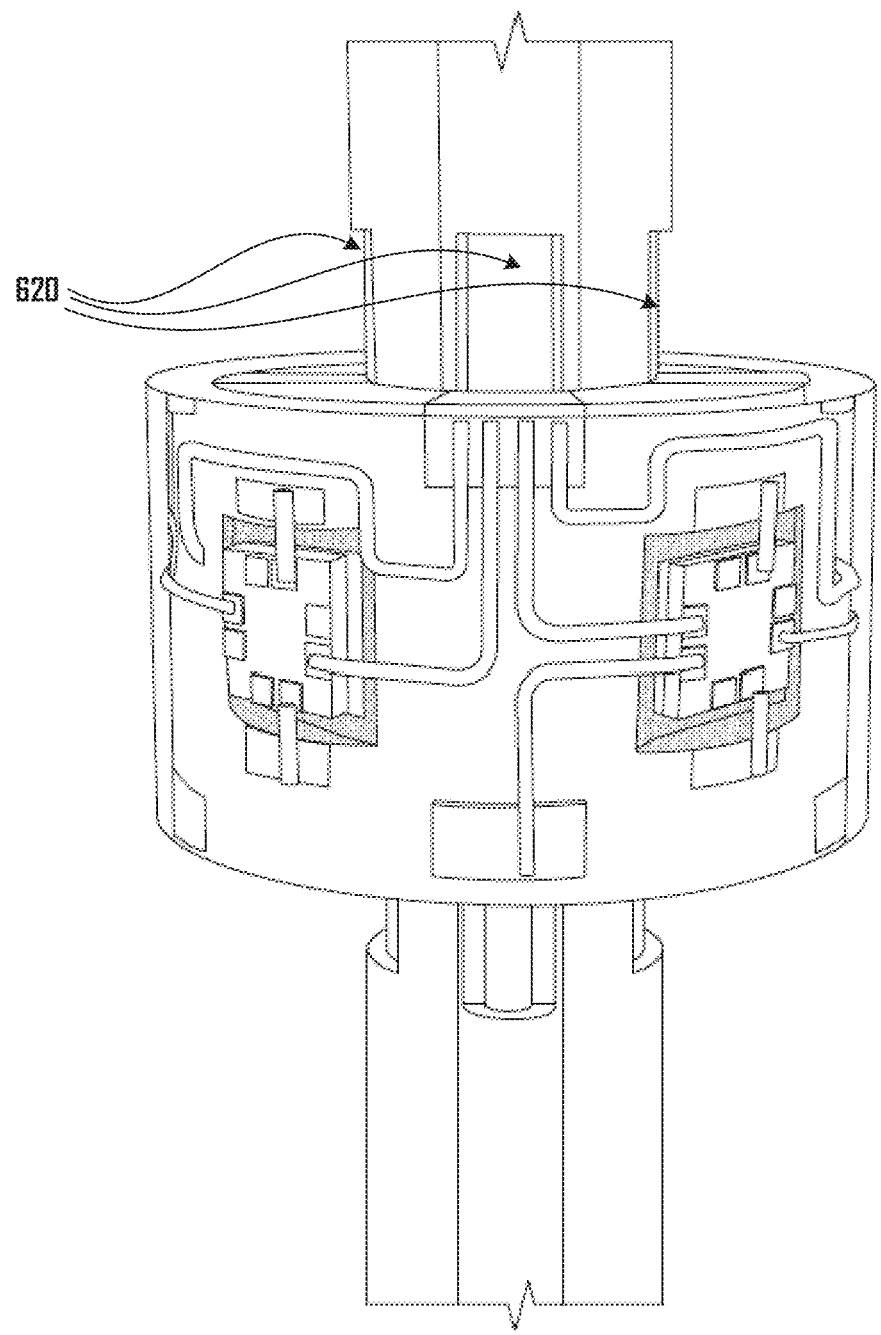

FIG. 22 illustrates a perspective view of the LED bead device 1100 of FIG. 18 positioned over the sealed or filled notches 2010 (not visible) in accordance with one embodiment. In this example, insulation 315 has been removed at insulation cuts 620, 625 from the conductors 310 of the flexible, interruptible radial bus 400 of FIG. 21 on either side of the notches 2010, such as described in connection with FIG. 6 above.

Figure 23:
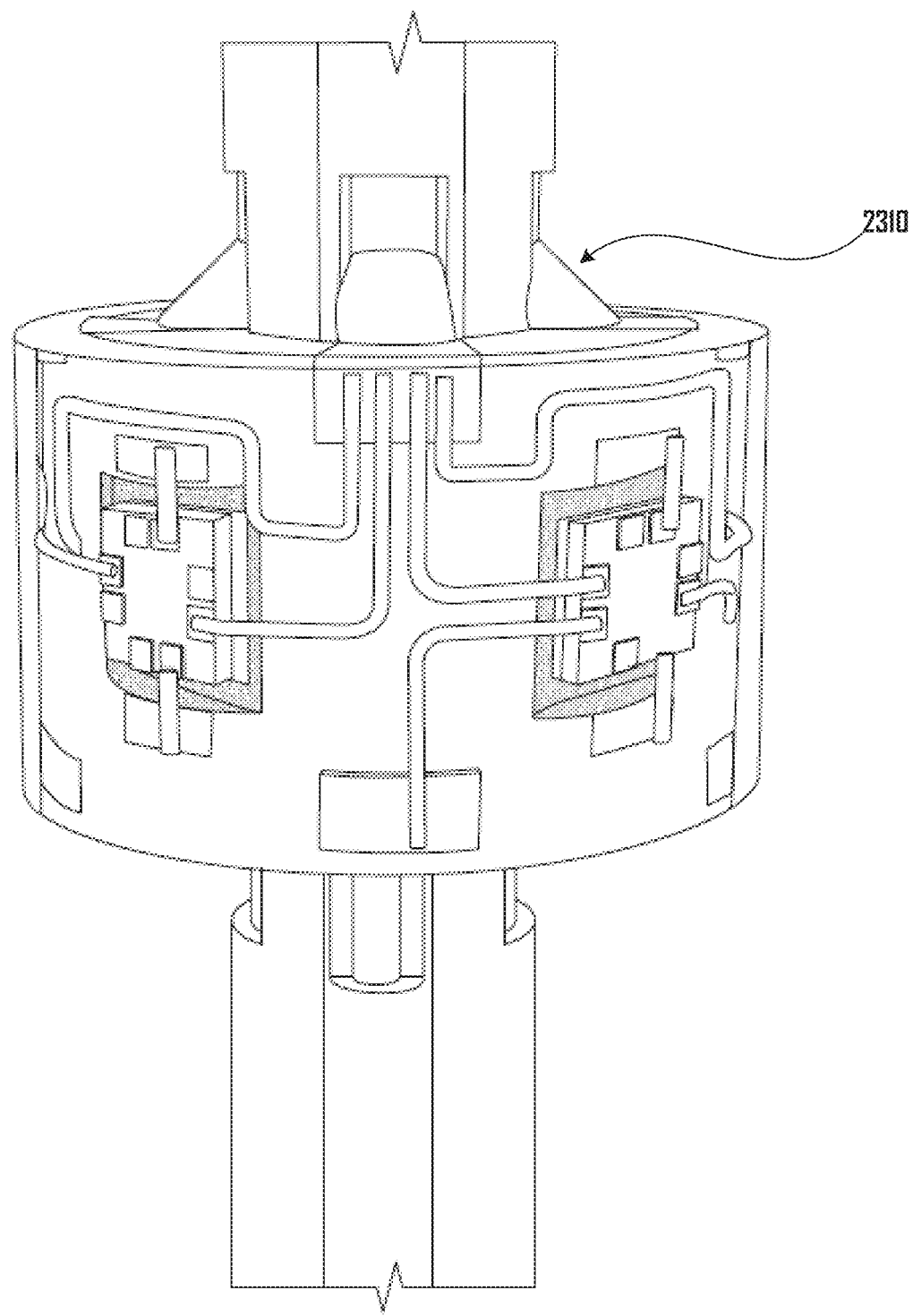

FIG. 23 illustrates a perspective view of soldering 2310 connecting the conductors of the flexible, interruptible radial bus to the LED bead device 1100 of FIG. 22 in accordance with one embodiment.

FIGS. 24-30 illustrate assembly and mounting of a two-part radial mounted device (RMD) on a flexible, interruptible radial bus in accordance with one embodiment.

Figure 24:
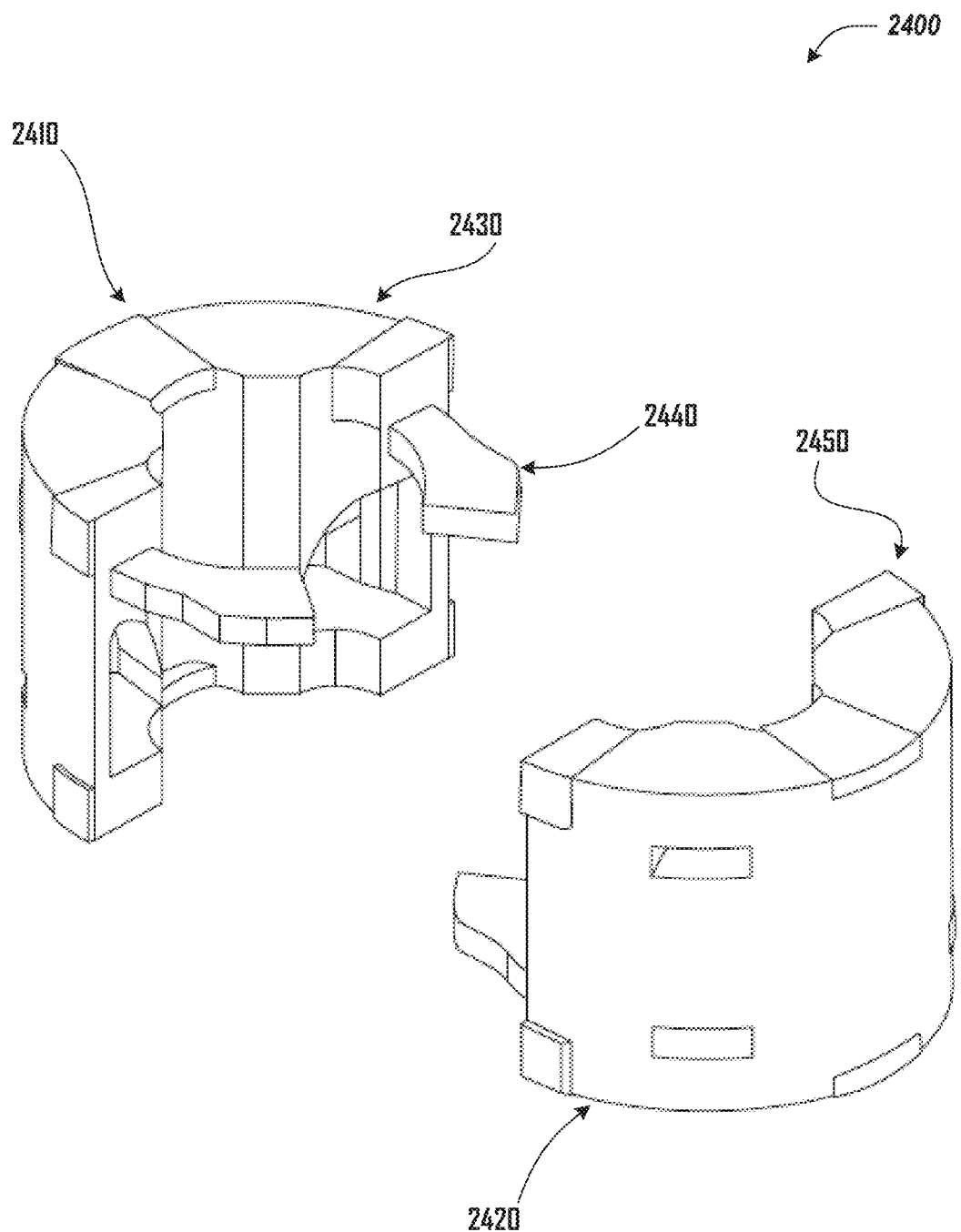

FIG. 24 illustrates an isometric view of a two-part radial mounted device (RMD) 2400 in accordance with one embodiment. The RMD 2400 is of generally similar construction to the LED bead device 1100 of FIGS. 11-18, but in two hemispheres or halves 2410, 2420. When one RMD hemisphere or half 2410 is combined with a matching or complementary hemisphere or half 2420 around a suitably prepared radial bus, a functional RMD 2400 is formed. An RMD 2400 may also be constructed in two parts that are not equal hemispheres (e.g., ⅓ and ⅔ circumferences) or in multiple parts. In this example, the conductive elements 1130, 1140 are approximately the same as those of FIG. 11; the filler 2430, in addition to being formed in halves, leaves space for the arms 2440 of the conductive elements 1130, 1140 to pass through; and the conductive pads 2450 are split such that they match up and can be connected, e.g., by solder. In some embodiments, the dividing line between parts of the RMD 2400 may be on an alternative axis such as not splitting conductive pads 2450.

Figure 25:
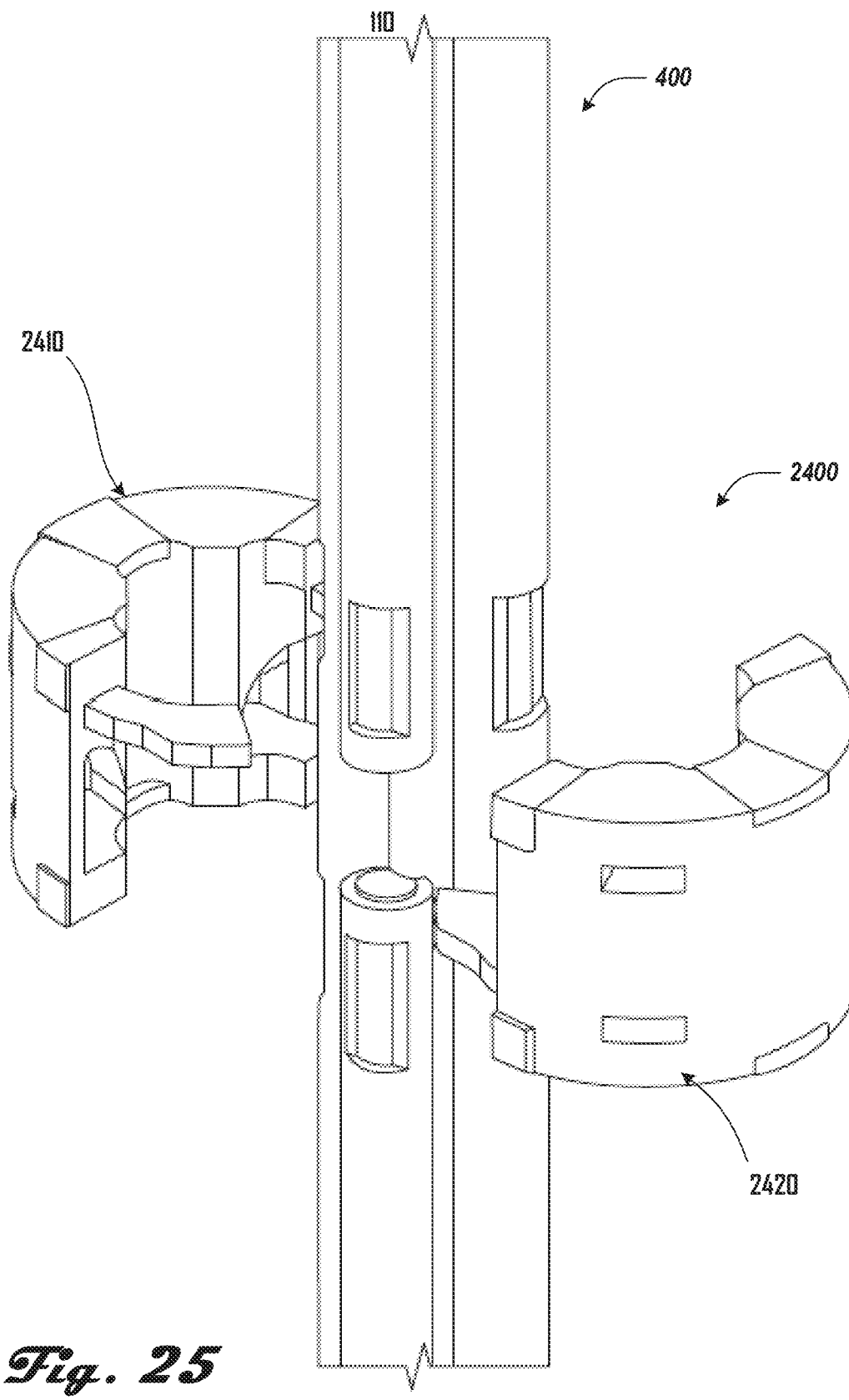

FIG. 25 illustrates an isometric view of the two-part radial mounted device 2400 of FIG. 24 with a four-wire flexible, interruptible radial bus 400 in accordance with one embodiment. In this example, the RMD 2400 is shown positioned around a radial bus that has been prepared for mounting at a location where notches have already been cut and insulation has been stripped from the wires. The perspective here shows the blue wire for data signal 110 at front left.

Figure 26B:
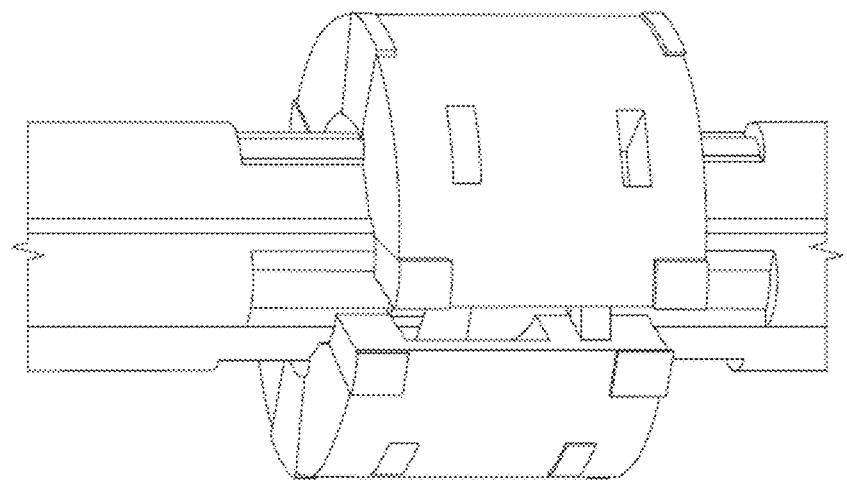
FIGS. 26A-26B illustrate isometric views of the opposing halves of the two-part LED bead device of FIG. 24 being brought together around the four-wire flexible, interruptible radial bus of FIG. 25 in accordance with one embodiment.
Figure 26A:
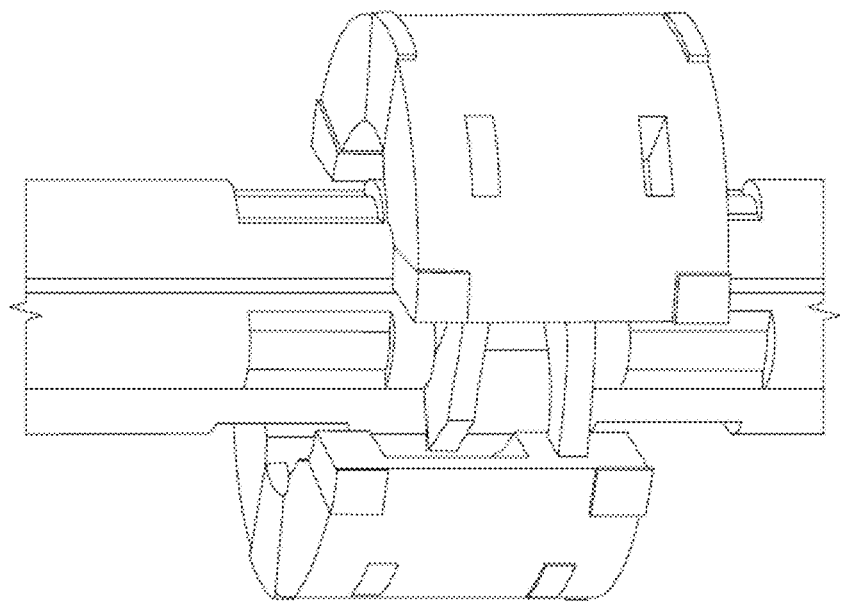

FIGS. 26A-26B illustrate isometric views of the opposing hemispheres or halves 2410, 2420 of the two-part radial mounted device 2400 of FIG. 24 being brought together around the four-wire flexible, interruptible radial bus 400 of FIG. 25 in accordance with one embodiment. The perspective here shows the green wire for clock signal 120 at front left.

Figure 27:
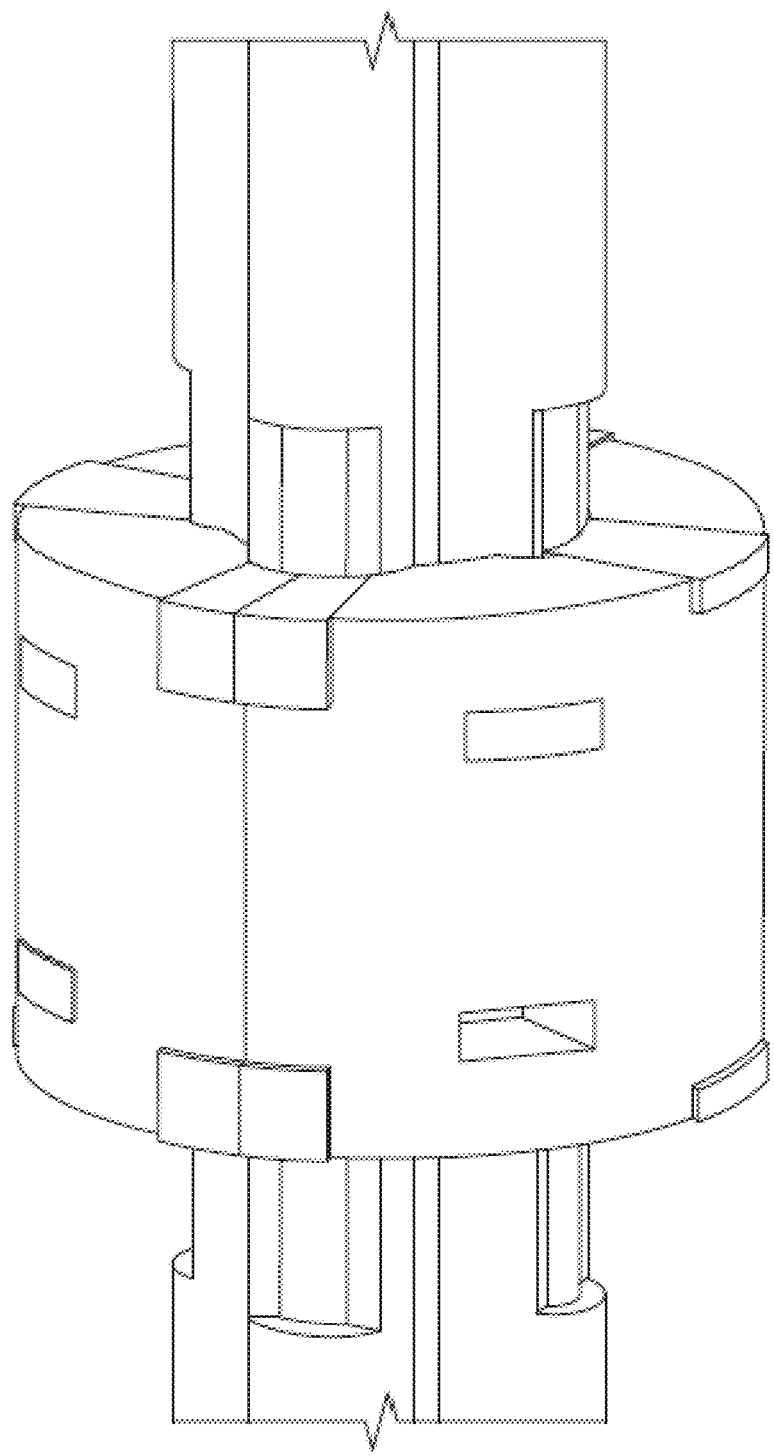

FIG. 27 illustrates an isometric view of the two-part radial mounted device 2400 of FIG. 24 assembled around the four-wire flexible, interruptible radial bus 400 of FIGS. 26A-26B in accordance with one embodiment.

Figure 28:
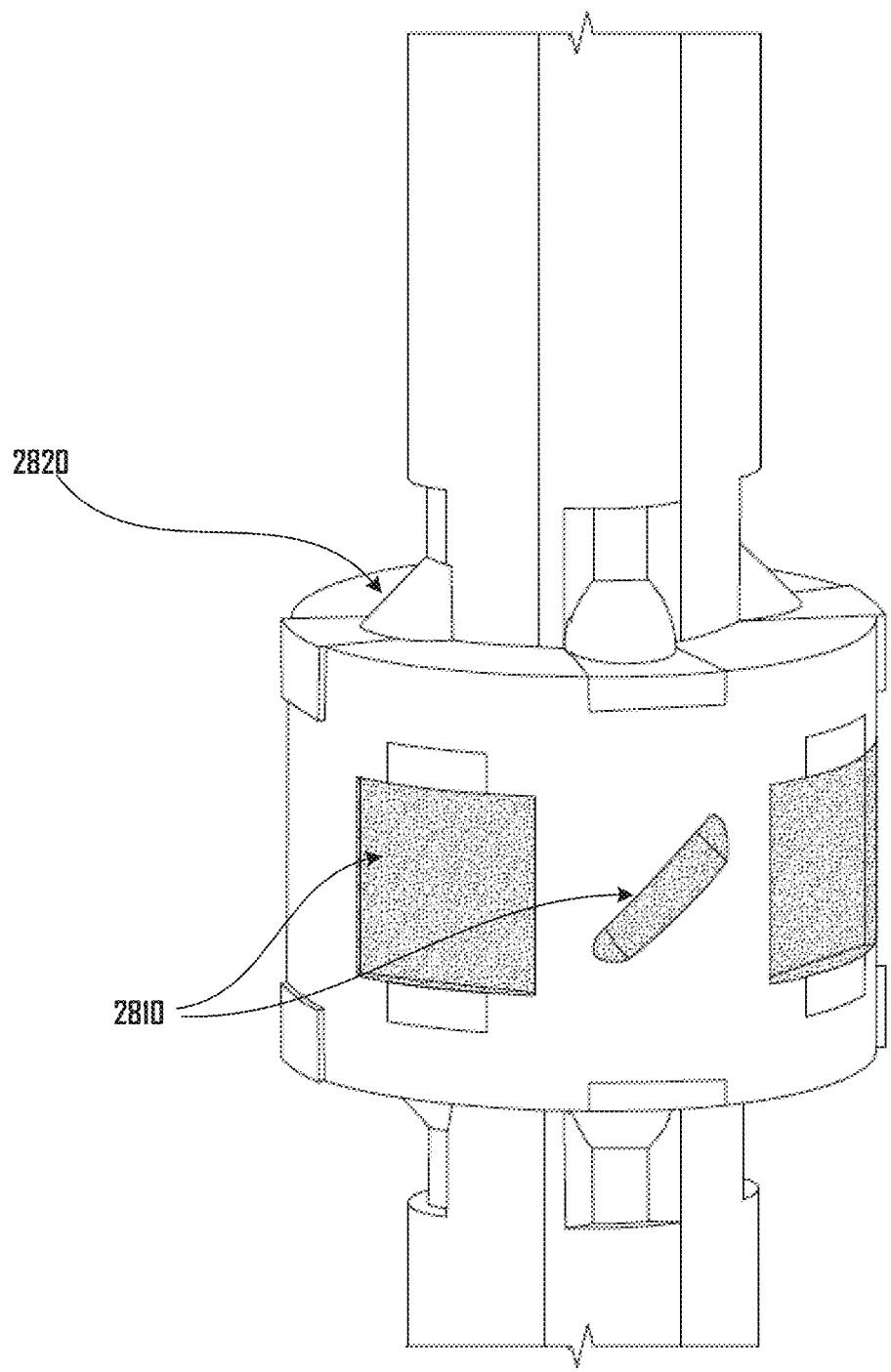

FIG. 28 illustrates an isometric view of shaping 2810 of the cylindrical exterior of the assembled two-part radial mounted device 2400 of FIG. 27 and soldering 2820 of the two-part radial mounted device 2400 to the four-wire flexible, interruptible radial bus 400 in accordance with one embodiment. Shaping 2810, e.g., milling or molding, may be performed before assembly of the radial mounted device's hemispheres or halves 2410, 2420. The perspective here is rotated approximately 45 degrees from FIG. 27.

Figure 29:
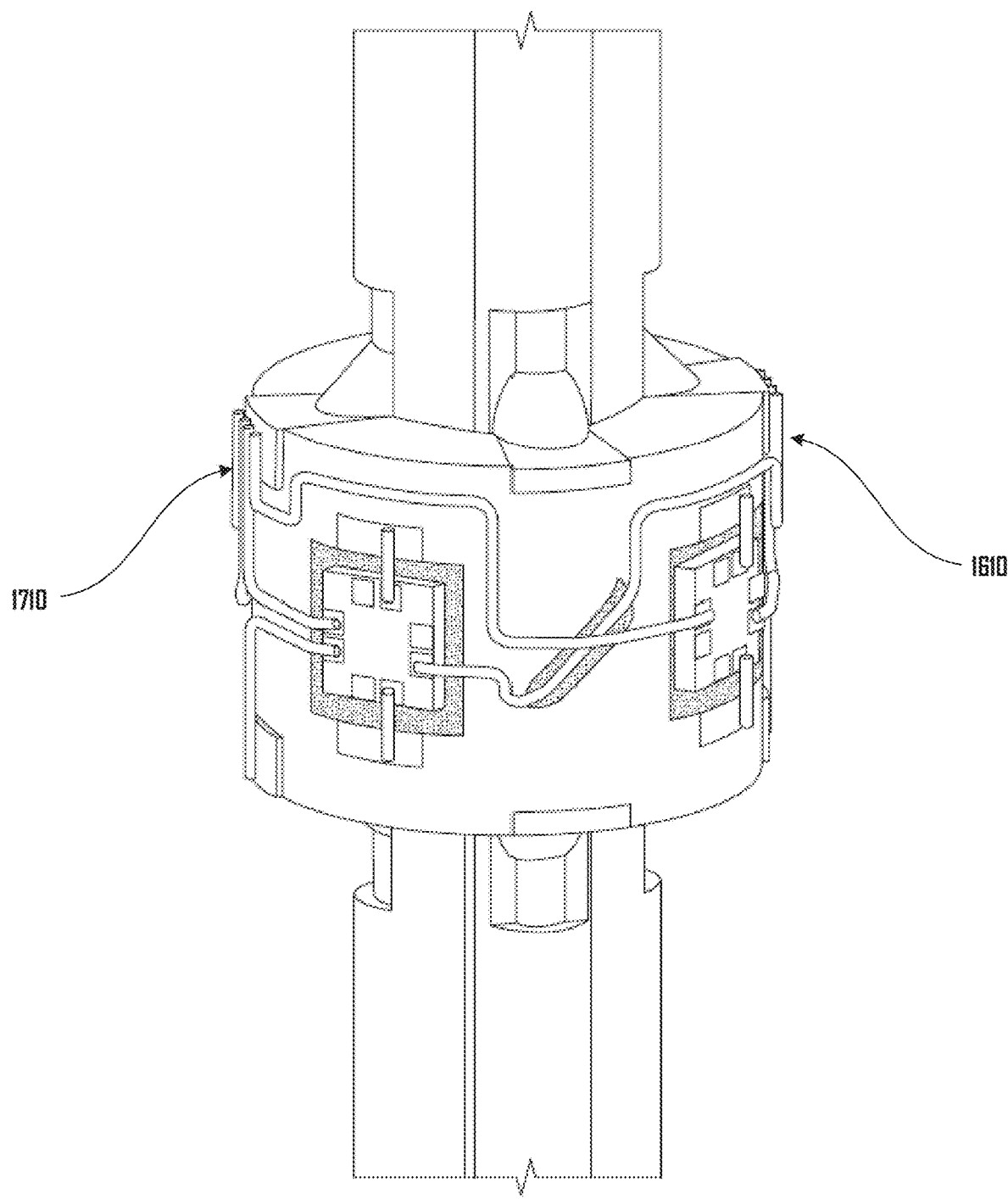

FIG. 29 illustrates an isometric view of the assembled two-part radial mounted device 2400 of FIG. 28 including SMD dies 1410 and power lead 1530, ground lead 1540, data signal lead 1610, and clock signal in lead 1720 and clock signal out lead 1725 wiring to the dies 1410 in accordance with one embodiment. This example shows a way of wiring dies 1410 to data signals 110 and clock signals 120 around opposite sides of the radial mounted device 2400 using shaping 2810 to allow one wire to cross below another.

Figure 30:
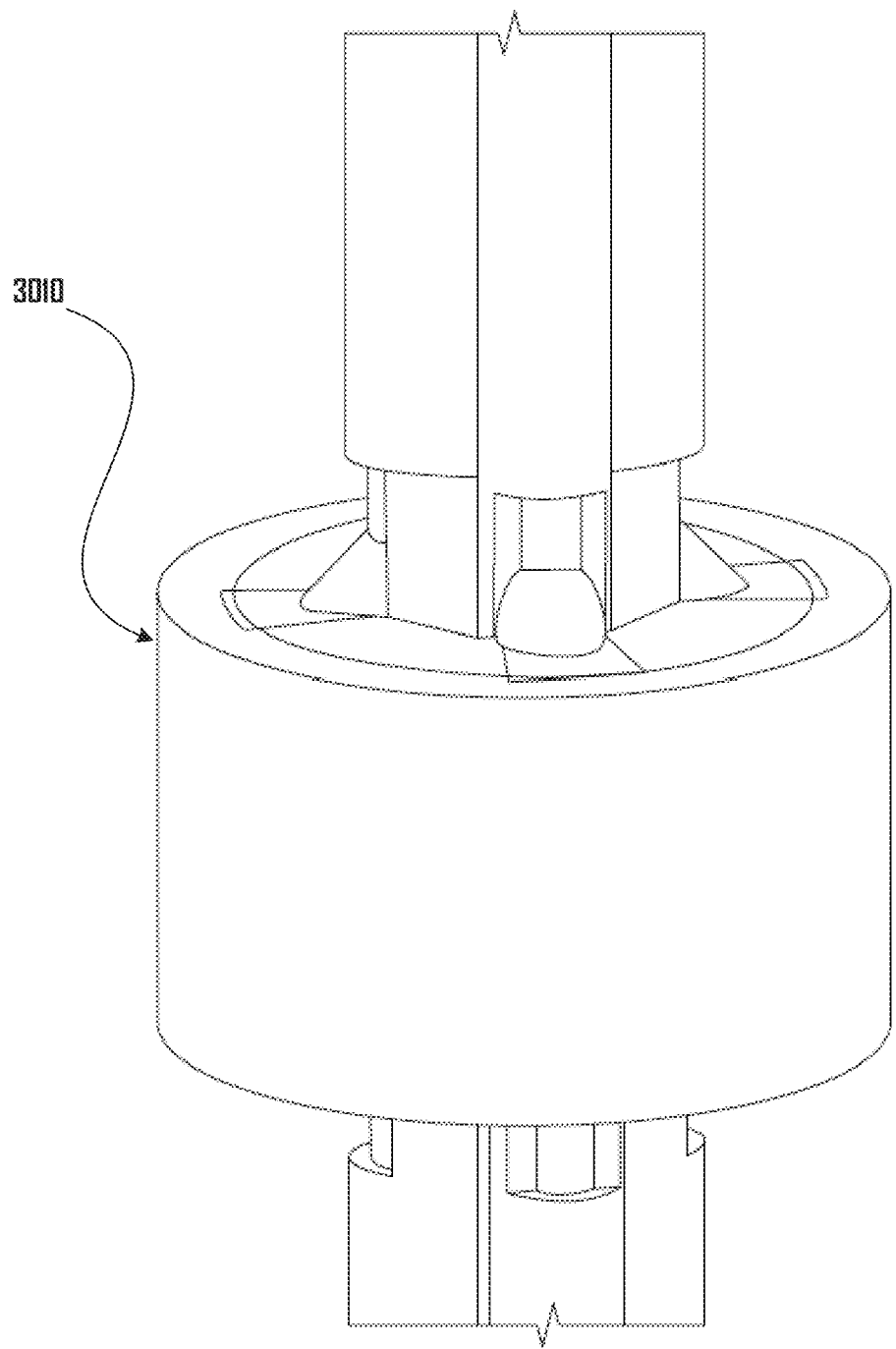

FIG. 30 illustrates an isometric view of an assembled radial mounted device 2400 having a translucent outer layer 3010 in accordance with one embodiment. In some embodiments, the radial mounted device 2400 is finished with, e.g., a flexible sealant, a relatively hard protective jacket such as a rubber or plastic, or some other covering around the solder connections between the radial mounted device and the flexible, interruptible radial bus.

FIGS. 31-39 illustrate construction, assembly, and mounting of a castellated two-part radial mounted device 3100 on a flexible, interruptible radial bus in accordance with one embodiment.

Figure 31:
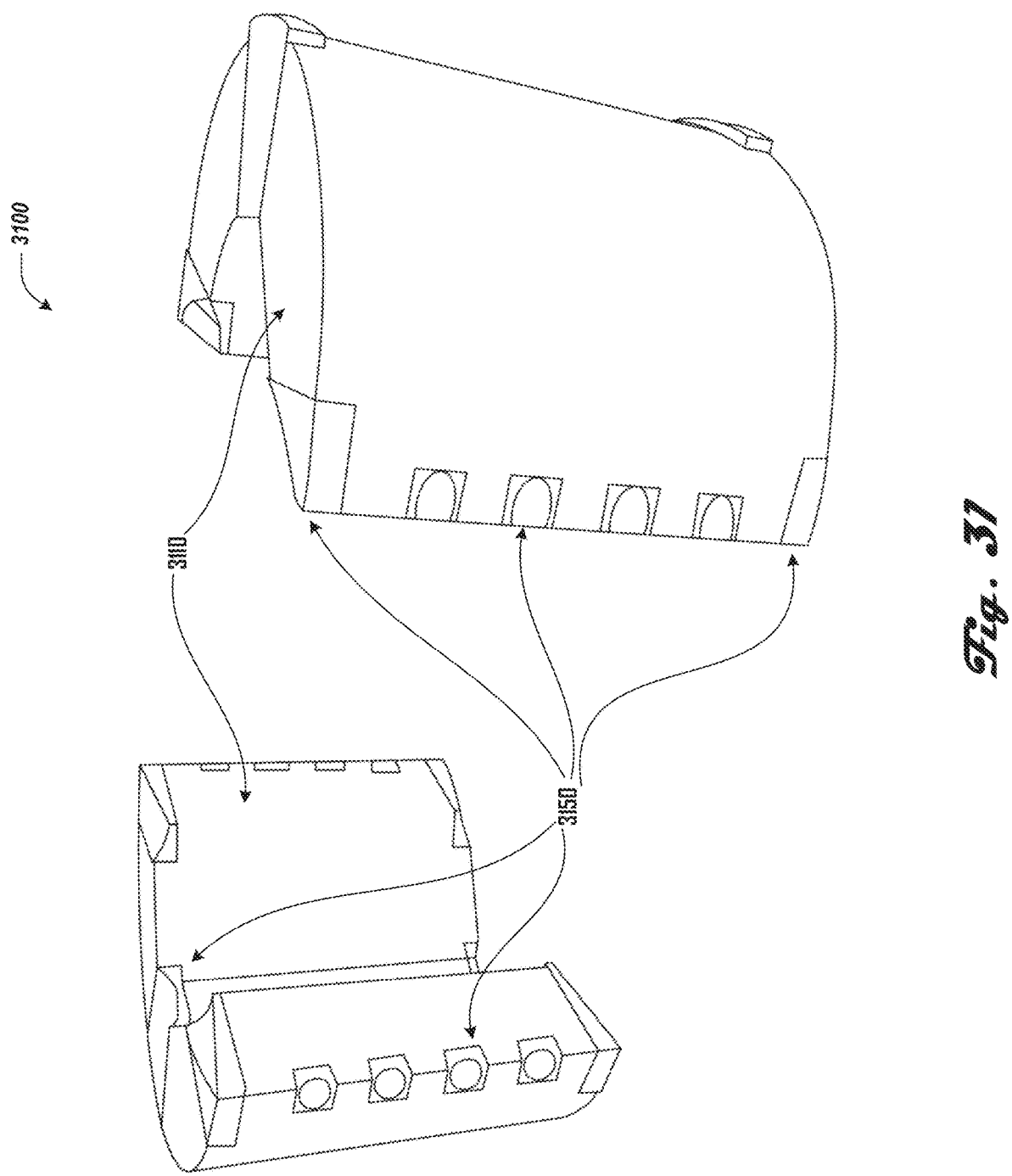

FIG. 31 illustrates a perspective view of two parts (opposing halves) of a castellated two-part radial mounted device 3100 in accordance with one embodiment. This shows an example general layout of conductive metal pads 3150 and non-conductive body material or filler 3110 without identifying the designation of particular connectors for specific purposes. In some embodiments, the radial mounted device can include fewer or more conductive elements.

Figure 32:
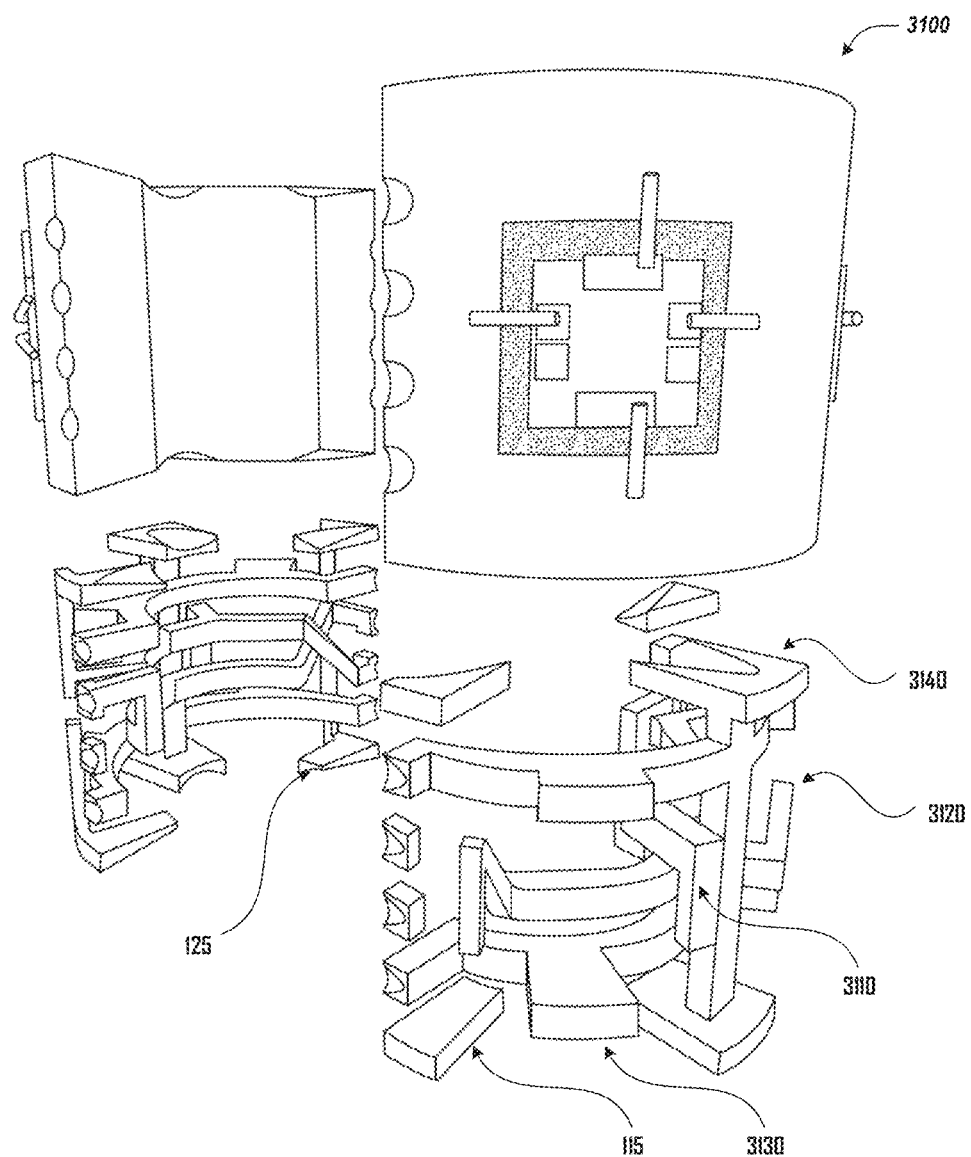

FIG. 32 illustrates an exploded breakout perspective view of the castellated two-part radial mounted device 3100 of FIG. 31 in accordance with one embodiment. Shown are example internal conductors for power or voltage 3230, ground 3240, data signals 3210, and clock signals 3220. A die 3260 with a slightly different arrangement of electrical connectors is pictured. In this example, the conductive elements are positioned as in a finished radial mounted device 3100; the filler 3110 may be flowed or formed around them, for example. 3D printing and other manufacturing techniques may also be employed.

FIGS. 33A-33B each illustrate a perspective view of the two parts (opposing or complementary halves 3310, 3320) of the castellated two-part radial mounted device 3100 of FIG. 32 including SMD dies 3260 and short power, data signal, and clock signal lead wiring to the dies in accordance with one embodiment. The internal conductors allow lead wiring to the dies 1410 to be short. The perspectives here are rotated approximately 180 degrees from FIG. 32.

Figure 34:
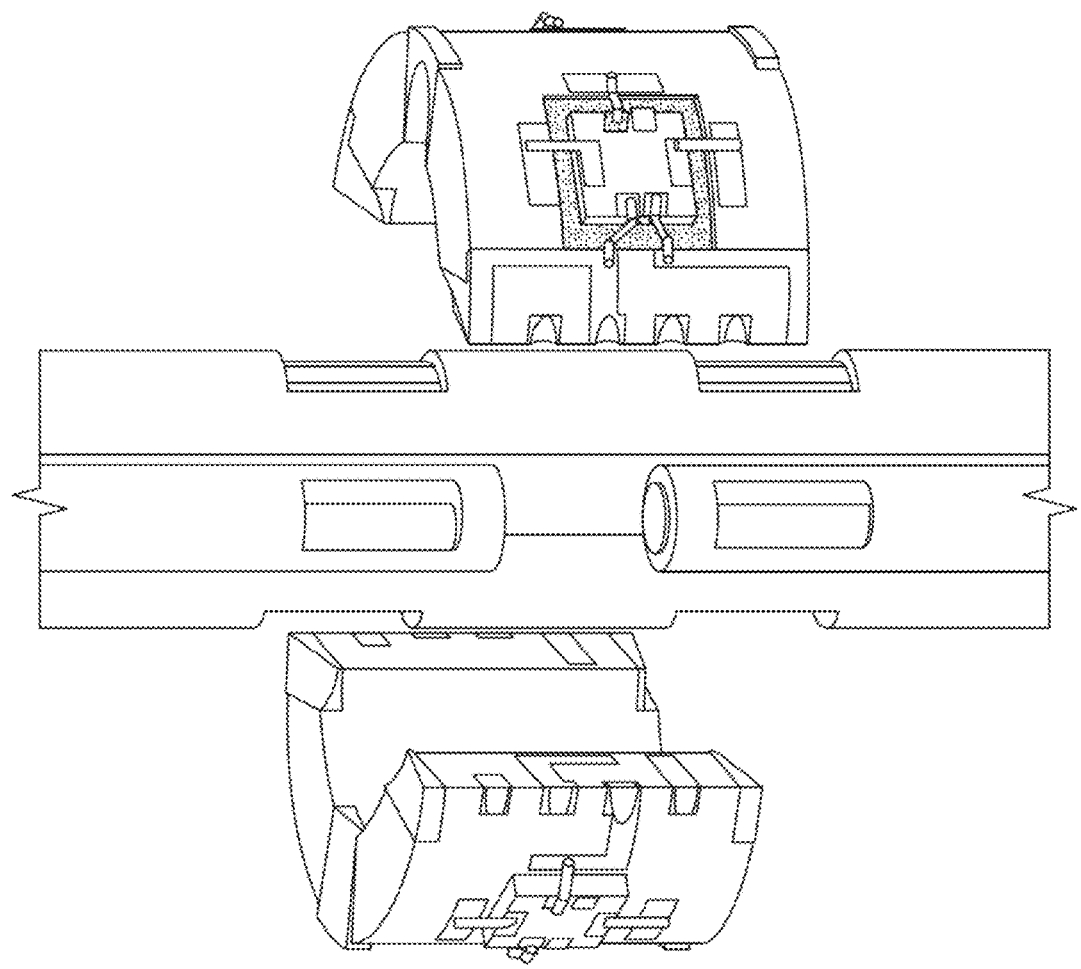

FIG. 34 illustrates a perspective view of the two parts (opposing or complementary halves 3310, 3320) of the castellated two-part radial mounted device 3100 of FIG. 33 positioned to be brought together around a four-wire flexible, interruptible radial bus 400 in accordance with one embodiment. The bus is prepared for mounting the radial mounted device at the mounting location with notches in interruptible conductors and insulation removed, such as described above in connection with FIG. 6 or FIG. 25.

Figure 35:
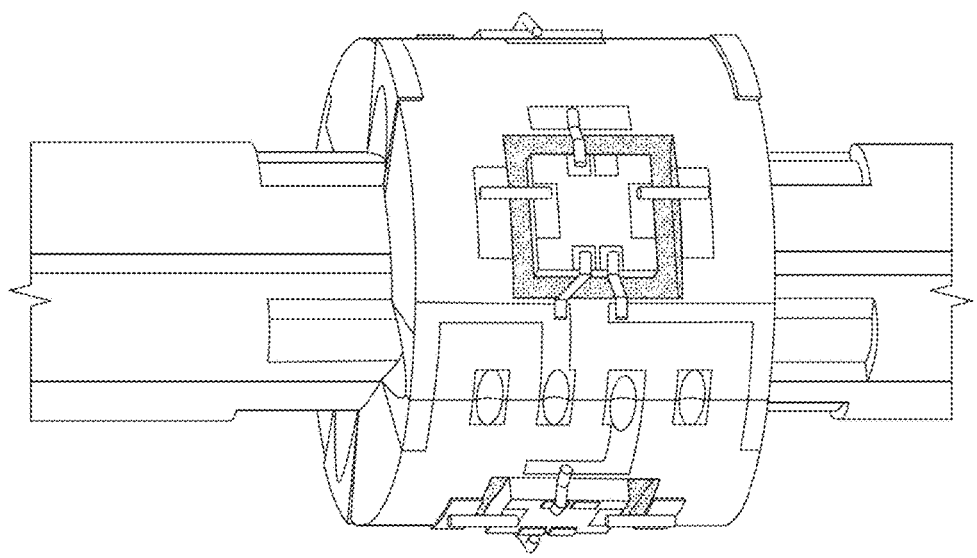

FIG. 35 illustrates a perspective view of the castellated two-part radial mounted device 3100 of FIG. 34 assembled around the four-wire flexible, interruptible radial bus 400 of FIG. 34 in accordance with one embodiment.

Figure 36:
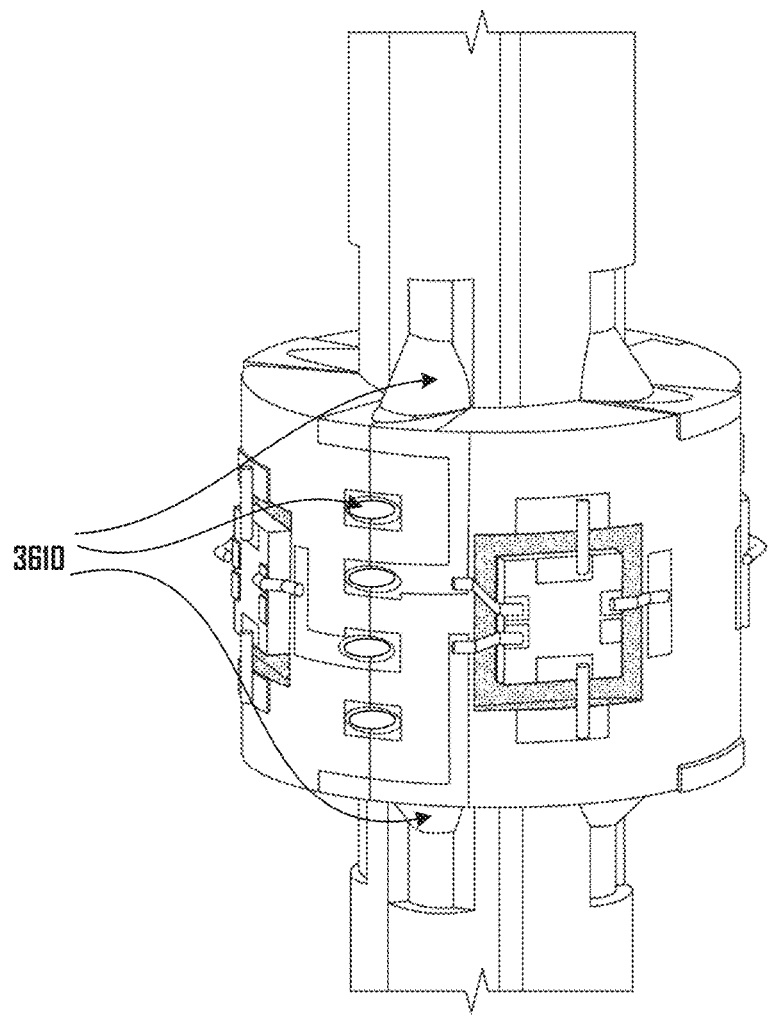

FIG. 36 illustrates a perspective view of the two parts (opposing or complementary halves) of the assembled castellated two-part radial mounted device 3100 of FIG. 35 soldered 3610 together and to the four-wire flexible, interruptible radial bus 400 in accordance with one embodiment. This allows connections to be completed with minimal wiring, enhancing robustness.

FIGS. 37A-37B illustrate perspective views of two parts (opposing or complementary halves) of a different castellated two-part radial mounted device 3700 having fewer conductive metal pads 3750 in accordance with one embodiment. The two parts or halves 3710, 3720 in this example are positioned to be brought together around a four-wire flexible, interruptible radial bus 400 in accordance with one embodiment. The bus 400 is prepared for mounting the radial mounted device at the mounting location with notches in interruptible conductors and insulation removed, such as described above in connection with FIG. 6 or FIG. 25. FIG. 37A shows a perspective with the blue wire for data signal 110 at front left and the red wire for power or voltage 130 at front right. FIG. 37B shows a perspective with the red wire for power or voltage 130 at front left and the green wire for clock signal 120 at front right. A die 3760 with a slightly different arrangement of electrical connectors is pictured.

Figure 38:
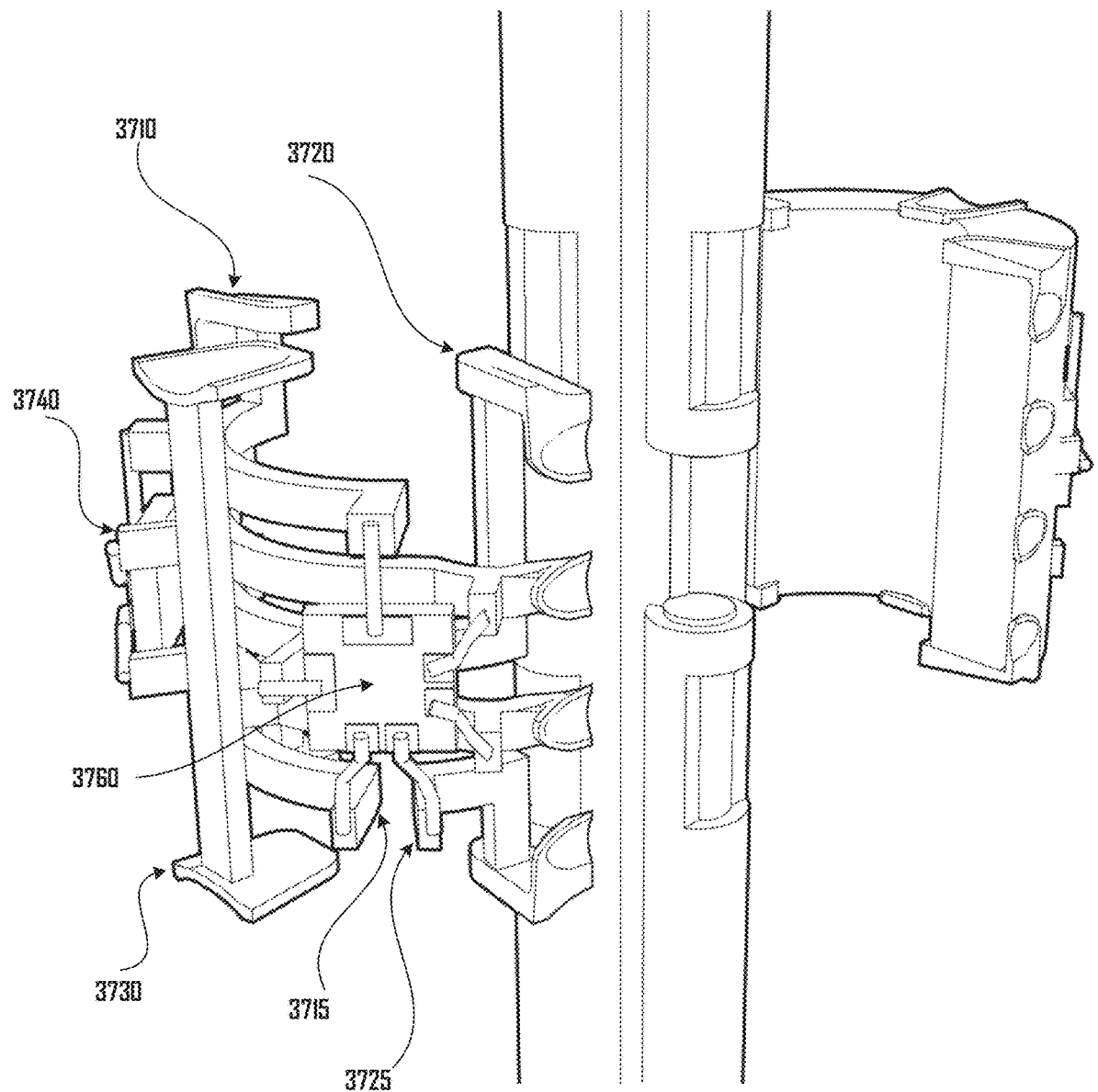

FIG. 38 illustrates an exploded breakout perspective view of the castellated two-part radial mounted device 3700 of FIGS. 37A-37B in accordance with one embodiment. Shown for one part or half 3720 of the radial mounted device 3700 are example internal conductors for power or voltage 3830, ground 3840, data signals in 3810 and out 3815, and clock signals in 3820 and out 3825. In this example, the conductive elements are positioned as in a finished radial mounted device 3700, with the filler not visible but the dies 3760 shown in place.

Figure 39:
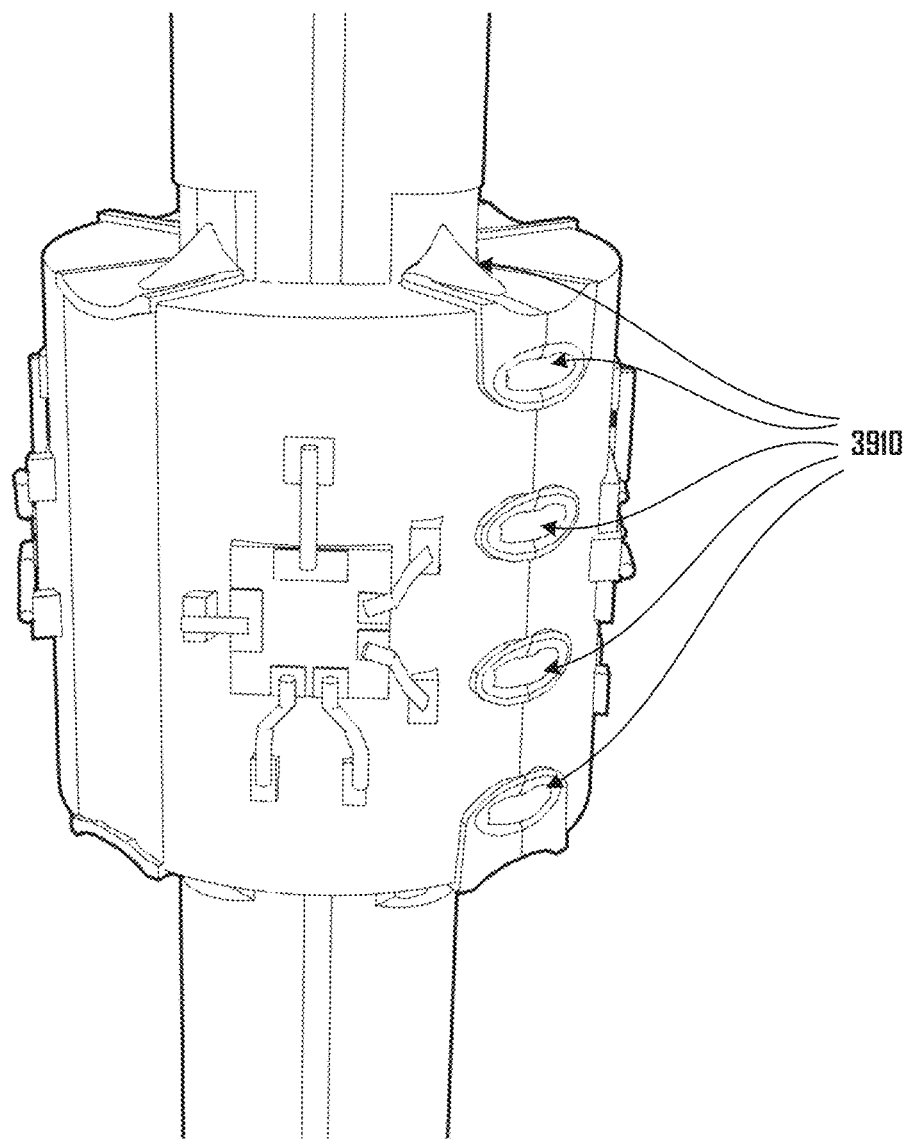

FIG. 39 illustrates a perspective view of the two parts or halves 3710, 3720 of the assembled castellated two-part radial mounted device 3700 of FIGS. 37A-37B soldered 3910 together and to the four-wire flexible, interruptible radial bus in accordance with one embodiment. In this example, the radial mounted device 3700 is configured with only four conductors on each side, reducing the amount of manufacturing complexity and soldering required.

Figure 40:
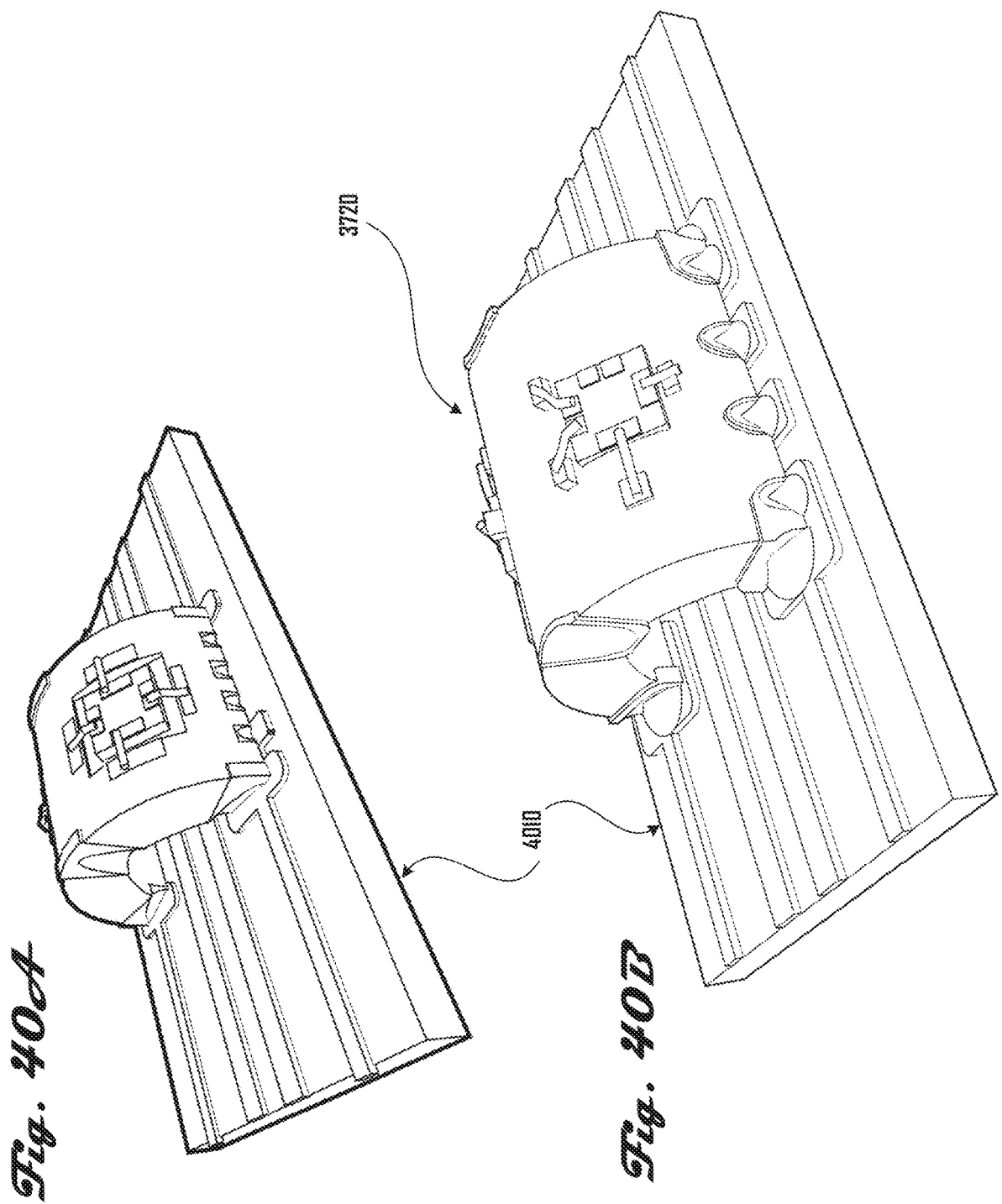
FIGS. 40A-40B illustrate perspective views of individual hemispherical parts of a two-part radial mounted device mounted in a SMD fashion to PCBs in accordance with one embodiment.

FIGS. 40A-40B illustrate perspective views of individual hemispherical parts of a two-part radial mounted device mounted in a SMD fashion to PCBs in accordance with one embodiment. FIG. 40A shows one part or half of the radial mounted device 3100 of FIGS. 31-36, and FIG. 40B shows one part or half 3720 of the radial mounted device 3700 of FIGS. 37A-39. In both examples, the hemispherical part or half of a two-part radial mounted device is a SMD mounted to a PCB 4010, 4110. It may similarly be mounted to a flex-print bus or any other convenient substrate. Thus, a single hemisphere of a device can be mounted in a SMD fashion or combined with a matching hemisphere to create a Radial Mounted Device (RMD).

Figure 41:
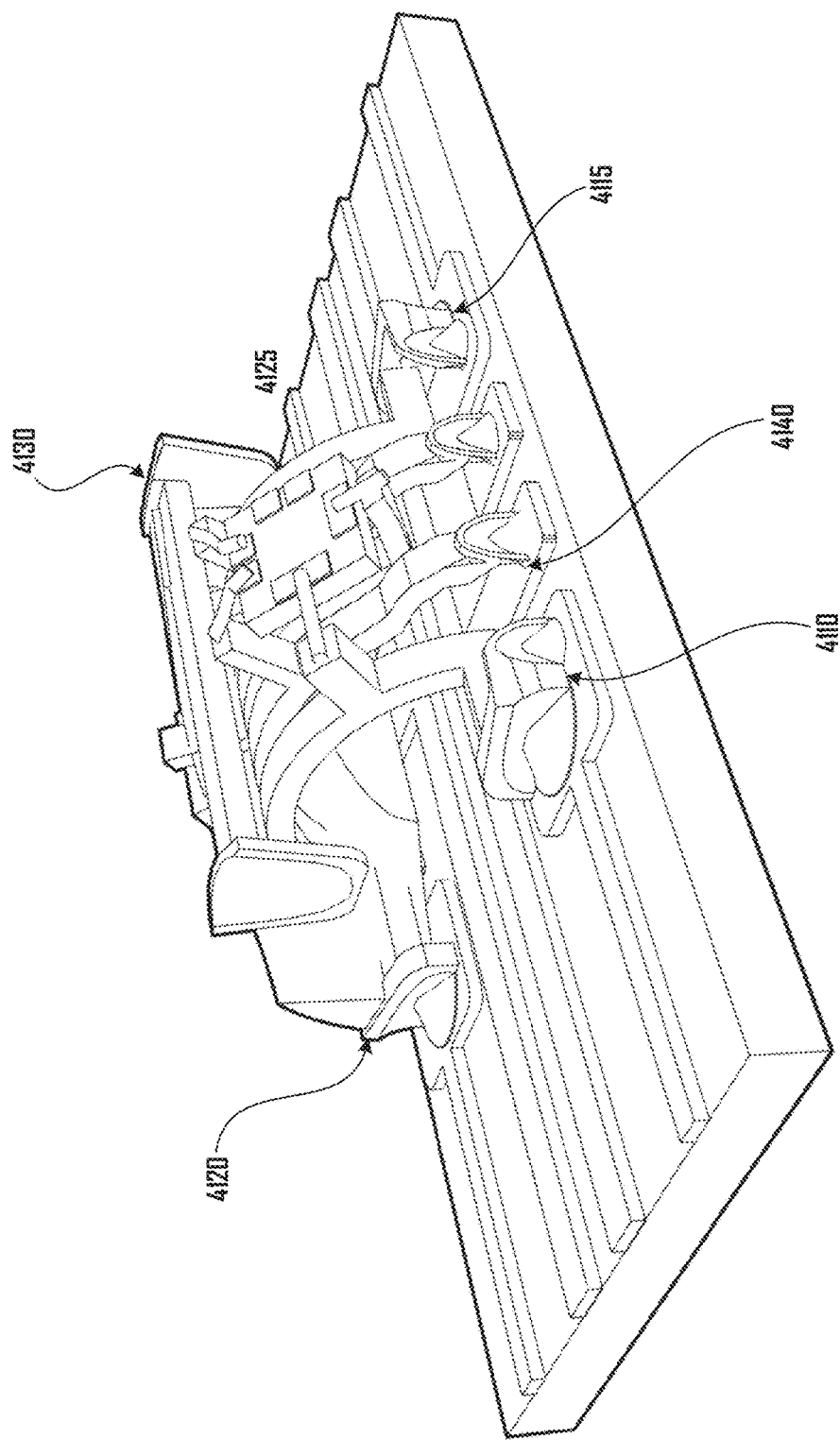
FIG. 41 illustrates a perspective cutaway view of one part of a radial mounted device mounted in a SMD fashion to a PCB in accordance with one embodiment.

FIG. 41 illustrates a perspective cutaway view of one part or half 3720 of a radial mounted device 3700 mounted in a SMD fashion to a PCB 4110 in accordance with one embodiment. The filler for approximately one half of the mounted part of the radial mounted device (roughly a quarter section) is cut away to show example internal conductors for power or voltage 3830, ground 3840, data signals in 3810 and out 3815, and clock signal in 3820, and the leads connecting them to the dies 3760, as well as solder connections to the PCB 4110. The clock signals out 3825 conductor (seen in FIG. 38) is not visible from this perspective; it is soldered to a lead 4125 on the PCB 4110.

Although specific embodiments have been illustrated and described herein, it will be appreciated by those of ordinary skill in the art that alternate and/or equivalent implementations may be substituted for the specific embodiments shown and described without departing from the scope of the present disclosure. For example, although various embodiments are described above in terms of LEDs, in other embodiments various other SMD devices may be used. In addition, the material forming the bus and/or any center connector may take different forms or have different cross-sections. This application is intended to cover any adaptations or variations of the embodiments discussed herein.

I claim:

1. A flexible, interruptible radial bus on which electronically addressable devices are mounted, comprising:
   a bus including at least three conductor wires arranged in a radial pattern, wherein:
   the at least three conductor wires are connected by a center stabilizer;
   at least a first conductor wire of the at least three conductor wires is uninterrupted through the bus; and
   at least a second conductor wire of the at least three conductor wires is interrupted at a mounting location along the bus.

2. The flexible, interruptible radial bus of claim 1 wherein the radial pattern in which the at least three conductor wires are arranged is substantially radially symmetrical.

3. A method of producing a flexible, interruptible radial bus on which electronically addressable devices are mounted, comprising:
   supplying a bus including at least three conductor wires arranged in a radial pattern, wherein:
   the at least three conductor wires are connected by a center stabilizer;
   at least a first conductor wire of the at least three conductor wires is uninterrupted through the bus; and
   at least a second conductor wire of the at least three conductor wires is interrupted at a mounting location along the bus.

4. The method of claim 3 wherein the center stabilizer positions an interruptible wire a distance outward from a central point or axis sufficient to enable a tool or machine to notch or otherwise interrupt the wire at the mounting location without notching or otherwise interrupting an adjacent wire of the bus.

5. The method of claim 3 wherein the center stabilizer contains a grounding wire that is used to reduce crosstalk between signal wires and enhance bus transmission speeds.

6. The method of claim 3 wherein the radial bus provides an improved range of flexibility or motion in at least one direction over a flat addressable bus design.

7. The flexible, interruptible radial bus of claim 1 wherein the radial pattern in which the at least three conductor wires are arranged is nonplanar.

8. The flexible, interruptible radial bus of claim 1 wherein the center stabilizer holds the at least three conductor wires around the center stabilizer in the radial pattern.

* * * * *